(12) United States Patent
Kogut et al.

(10) Patent No.: US 7,385,744 B2
(45) Date of Patent: Jun. 10, 2008

(54) SUPPORT STRUCTURE FOR FREE-STANDING MEMS DEVICE AND METHODS FOR FORMING THE SAME

(75) Inventors: Lior Kogut, Sunnyvale, CA (US); Ming-Hau Tung, San Francisco, CA (US); Brian Arbuckle, Danville, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 160 days.

(21) Appl. No.: 11/476,998

(22) Filed: Jun. 28, 2006

(65) Prior Publication Data

US 2008/0003710 A1    Jan. 3, 2008

(51) Int. Cl.
*G02B 26/08*    (2006.01)
*G02B 26/00*    (2006.01)

(52) U.S. Cl. .................. 359/198; 359/223; 359/290
(58) Field of Classification Search ........... 359/198, 359/212, 214, 223, 224, 247, 290, 295, 298, 359/302
See application file for complete search history.

(56) References Cited

U.S. PATENT DOCUMENTS

| | | |
|---|---|---|
| 2,534,846 A | 12/1950 | Ambrose et al. |
| 3,439,973 A | 4/1969 | Paul et al. |
| 3,443,854 A | 5/1969 | Weiss |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |

(Continued)

FOREIGN PATENT DOCUMENTS

CN           157313           5/1991

(Continued)

OTHER PUBLICATIONS

Taii et al., "A transparent sheet display by plastic MEMS," Journal of the SID 14(8):735-741, 2006

(Continued)

*Primary Examiner*—William C Choi
(74) *Attorney, Agent, or Firm*—Knobbe, Martens, Olson & Bear, LLP

(57) ABSTRACT

A microelectromechanical (MEMS) device includes a functional layer including a first material and a deformable layer including a second material. The second material is different from the first material. The deformable layer is mechanically coupled to the functional layer at a junction. The functional layer and the deformable layer have substantially equal internal stresses at the junction.

44 Claims, 17 Drawing Sheets

U.S. PATENT DOCUMENTS

| | | |
|---|---|---|
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,666,254 A | 5/1987 | Itoh et al. |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,857,978 A | 8/1989 | Goldburt et al. |
| 4,859,060 A | 8/1989 | Katagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,331,454 A | 7/1994 | Hornbeck |
| 5,339,116 A | 8/1994 | Urbanus et al. |
| 5,345,328 A | 9/1994 | Fritz et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | Van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,614,937 A | 3/1997 | Nelson |
| 5,619,059 A | 4/1997 | Li et al. |
| 5,619,365 A | 4/1997 | Rhoades et al. |
| 5,619,366 A | 4/1997 | Rhoads et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,768 A | 7/1997 | Kaeiyama |
| 5,650,881 A | 7/1997 | Hornbeck |

| | | | | | | |
|---|---|---|---|---|---|---|
| 5,654,741 | A | 8/1997 | Sampsell et al. | 6,433,917 | B1 | 8/2002 | Mei et al. |
| 5,657,099 | A | 8/1997 | Doherty et al. | 6,438,282 | B1 | 8/2002 | Takeda et al. |
| 5,659,374 | A | 8/1997 | Gale, Jr. et al. | 6,447,126 | B1 | 9/2002 | Hornbeck |
| 5,661,591 | A | 8/1997 | Lin et al. | 6,449,084 | B1 | 9/2002 | Guo |
| 5,665,997 | A | 9/1997 | Weaver et al. | 6,456,420 | B1 | 9/2002 | Goodwin-Johansson |
| 5,673,139 | A | 9/1997 | Johnson | 6,465,355 | B1 | 10/2002 | Horsley |
| 5,683,591 | A | 11/1997 | Offenberg | 6,466,190 | B1 | 10/2002 | Evoy |
| 5,703,710 | A | 12/1997 | Brinkman et al. | 6,466,354 | B1 | 10/2002 | Gudeman |
| 5,710,656 | A | 1/1998 | Goosen | 6,466,358 | B2 | 10/2002 | Tew |
| 5,726,480 | A | 3/1998 | Pister | 6,473,072 | B1 | 10/2002 | Comiskey et al. |
| 5,739,945 | A | 4/1998 | Tayebati | 6,473,274 | B1 | 10/2002 | Maimone et al. |
| 5,740,150 | A | 4/1998 | Uchimaru et al. | 6,480,177 | B2 | 11/2002 | Doherty et al. |
| 5,745,193 | A | 4/1998 | Urbanus et al. | 6,496,122 | B2 | 12/2002 | Sampsell |
| 5,745,281 | A | 4/1998 | Yi et al. | 6,545,335 | B1 | 4/2003 | Chua et al. |
| 5,751,469 | A | 5/1998 | Arney et al. | 6,548,908 | B2 | 4/2003 | Chua et al. |
| 5,771,116 | A | 6/1998 | Miller et al. | 6,549,338 | B1 | 4/2003 | Wolverton et al. |
| 5,784,190 | A | 7/1998 | Worley | 6,552,840 | B2 | 4/2003 | Knipe |
| 5,784,212 | A | 7/1998 | Hornbeck | 6,574,033 | B1 | 6/2003 | Chui et al. |
| 5,786,927 | A | 7/1998 | Greywall et al. | 6,589,625 | B1 | 7/2003 | Kothari et al. |
| 5,793,504 | A | 8/1998 | Stoll | 6,600,201 | B2 | 7/2003 | Hartwell et al. |
| 5,808,780 | A | 9/1998 | McDonald | 6,606,175 | B1 | 8/2003 | Sampsell et al. |
| 5,808,781 | A | 9/1998 | Arney et al. | 6,608,268 | B1 | 8/2003 | Goldsmith |
| 5,818,095 | A | 10/1998 | Sampsell | 6,624,944 | B1 | 9/2003 | Wallace et al. |
| 5,825,528 | A | 10/1998 | Goosen | 6,625,047 | B2 | 9/2003 | Coleman, Jr. |
| 5,835,255 | A | 11/1998 | Miles | 6,630,786 | B2 | 10/2003 | Cummings et al. |
| 5,838,484 | A | 11/1998 | Goossen et al. | 6,632,698 | B2 | 10/2003 | Ives |
| 5,842,088 | A | 11/1998 | Thompson | 6,635,919 | B1 | 10/2003 | Melendez et al. |
| 5,867,302 | A | 2/1999 | Fleming | 6,643,069 | B2 | 11/2003 | Dewald |
| 5,905,482 | A | 5/1999 | Hughes et al. | 6,650,455 | B2 | 11/2003 | Miles |
| 5,912,758 | A | 6/1999 | Knipe et al. | 6,657,832 | B2 | 12/2003 | Williams et al. |
| 5,914,803 | A * | 6/1999 | Hwang et al. ............... 359/291 | 6,660,656 | B2 | 12/2003 | Cheung et al. |
| 5,943,158 | A | 8/1999 | Ford et al. | 6,666,561 | B1 | 12/2003 | Blackley |
| 5,959,763 | A | 9/1999 | Bozler et al. | 6,674,033 | B1 | 1/2004 | Wang et al. |
| 5,986,796 | A | 11/1999 | Miles | 6,674,090 | B1 | 1/2004 | Chua et al. |
| 5,994,174 | A | 11/1999 | Carey et al. | 6,674,562 | B1 | 1/2004 | Miles et al. |
| 6,028,689 | A | 2/2000 | Michalicek et al. | 6,680,792 | B2 | 1/2004 | Miles |
| 6,028,690 | A | 2/2000 | Carter et al. | 6,710,908 | B2 | 3/2004 | Miles et al. |
| 6,038,056 | A | 3/2000 | Florence et al. | 6,741,377 | B2 | 5/2004 | Miles |
| 6,040,937 | A | 3/2000 | Miles | 6,741,383 | B2 | 5/2004 | Huibers et al. |
| 6,046,840 | A | 4/2000 | Huibers | 6,741,384 | B1 | 5/2004 | Martin et al. |
| 6,049,317 | A | 4/2000 | Thompson et al. | 6,741,503 | B1 | 5/2004 | Farris et al. |
| 6,055,090 | A | 4/2000 | Miles | 6,747,785 | B2 | 6/2004 | Chen et al. |
| 6,056,406 | A | 5/2000 | Park et al. | 6,747,800 | B1 | 6/2004 | Lin |
| 6,061,075 | A | 5/2000 | Nelson et al. | 6,775,174 | B2 | 8/2004 | Huffman et al. |
| 6,097,145 | A | 8/2000 | Kastalsky et al. | 6,778,155 | B2 | 8/2004 | Doherty et al. |
| 6,099,132 | A | 8/2000 | Kaeriyama | 6,794,119 | B2 | 9/2004 | Miles |
| 6,100,872 | A | 8/2000 | Aratani et al. | 6,809,788 | B2 | 10/2004 | Yamada et al. |
| 6,113,239 | A | 9/2000 | Sampsell et al. | 6,811,267 | B1 | 11/2004 | Allen et al. |
| 6,147,790 | A | 11/2000 | Meier et al. | 6,819,469 | B1 | 11/2004 | Koha |
| 6,158,156 | A | 12/2000 | Patrick | 6,822,628 | B2 | 11/2004 | Dunphy et al. |
| 6,160,833 | A | 12/2000 | Floyd et al. | 6,829,132 | B2 | 12/2004 | Martin et al. |
| 6,171,945 | B1 | 1/2001 | Mandal et al. | 6,841,081 | B2 | 1/2005 | Chang et al. |
| 6,172,797 | B1 | 1/2001 | Huibers | 6,853,129 | B1 | 2/2005 | Cummings et al. |
| 6,180,428 | B1 | 1/2001 | Peeters et al. | 6,855,610 | B2 | 2/2005 | Tung et al. |
| 6,195,196 | B1 | 2/2001 | Kimura et al. | 6,859,218 | B1 | 2/2005 | Luman et al. |
| 6,201,633 | B1 | 3/2001 | Peeters et al. | 6,861,277 | B1 | 3/2005 | Monroe et al. |
| 6,215,221 | B1 | 4/2001 | Cabuz et al. | 6,862,022 | B2 | 3/2005 | Slupe |
| 6,232,936 | B1 | 5/2001 | Gove et al. | 6,862,029 | B1 | 3/2005 | D'Souza et al. |
| 6,239,777 | B1 | 5/2001 | Sugahara et al. | 6,867,896 | B2 | 3/2005 | Miles |
| 6,243,149 | B1 | 6/2001 | Swanson et al. | 6,870,581 | B2 | 3/2005 | Li et al. |
| 6,282,010 | B1 | 8/2001 | Sulzbach et al. | 6,870,654 | B2 | 3/2005 | Lin et al. |
| 6,288,472 | B1 | 9/2001 | Cabuz et al. | 6,882,458 | B2 | 4/2005 | Lin et al. |
| 6,288,824 | B1 | 9/2001 | Kastalsky | 6,882,461 | B1 | 4/2005 | Tsai et al. |
| 6,295,154 | B1 | 9/2001 | Laor et al. | 6,891,658 | B2 | 5/2005 | Whitehead et al. |
| 6,323,982 | B1 | 11/2001 | Hornbeck | 6,912,022 | B1 | 6/2005 | Lin et al. |
| 6,327,071 | B1 | 12/2001 | Kimura | 6,940,630 | B2 | 9/2005 | Xie |
| 6,331,909 | B1 | 12/2001 | Dunfield | 6,947,200 | B2 | 9/2005 | Huibers |
| 6,335,831 | B2 | 1/2002 | Kowarz et al. | 6,952,303 | B2 | 10/2005 | Lin et al. |
| 6,356,254 | B1 | 3/2002 | Kimura | 6,958,847 | B2 | 10/2005 | Lin |
| 6,358,021 | B1 | 3/2002 | Cabuz | 6,959,990 | B2 | 11/2005 | Penn |
| 6,376,787 | B1 | 4/2002 | Martin et al. | 6,980,350 | B2 | 12/2005 | Hung et al. |
| 6,407,851 | B1 | 6/2002 | Islam et al. | 7,008,812 | B1 | 3/2006 | Carley |
| 6,417,868 | B1 | 7/2002 | Bock et al. | 7,053,737 | B2 | 5/2006 | Schwartz et al. |

| | | |
|---|---|---|
| 7,075,700 B2 | 7/2006 | Muenter |
| 7,123,216 B1 | 10/2006 | Miles |
| 7,236,284 B2 | 6/2007 | Miles |
| 2001/0003487 A1 | 6/2001 | Miles |
| 2001/0028503 A1 | 10/2001 | Flanders et al. |
| 2002/0014579 A1 | 2/2002 | Dunfield |
| 2002/0015215 A1 | 2/2002 | Miles |
| 2002/0021485 A1 | 2/2002 | Pilossof |
| 2002/0024711 A1 | 2/2002 | Miles |
| 2002/0027636 A1 | 3/2002 | Yamada |
| 2002/0054424 A1 | 5/2002 | Miles |
| 2002/0075555 A1 | 6/2002 | Miles |
| 2002/0114558 A1 | 8/2002 | Nemirovsky |
| 2002/0126364 A1 | 9/2002 | Miles |
| 2002/0139981 A1 | 10/2002 | Young |
| 2002/0146200 A1 | 10/2002 | Kurdle et al. |
| 2002/0149828 A1 | 10/2002 | Miles |
| 2002/0149850 A1 | 10/2002 | Heffner et al. |
| 2002/0167072 A1 | 11/2002 | Andosca |
| 2002/0167730 A1 | 11/2002 | Needham et al. |
| 2002/0186483 A1 | 12/2002 | Hagelin et al. |
| 2003/0015936 A1 | 1/2003 | Yoon et al. |
| 2003/0016428 A1 | 1/2003 | Kato et al. |
| 2003/0029705 A1 | 2/2003 | Qui et al. |
| 2003/0035196 A1 | 2/2003 | Walker |
| 2003/0043157 A1 | 3/2003 | Miles |
| 2003/0053078 A1 | 3/2003 | Missey et al. |
| 2003/0072070 A1 | 4/2003 | Miles |
| 2003/0156315 A1 | 8/2003 | Li et al. |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0051929 A1 | 3/2004 | Sampsell et al. |
| 2004/0056742 A1 | 3/2004 | Dabbaj |
| 2004/0058532 A1 | 3/2004 | Miles et al. |
| 2004/0075967 A1 | 4/2004 | Lynch et al. |
| 2004/0080035 A1 | 4/2004 | Delapierre |
| 2004/0080807 A1 | 4/2004 | Chen et al. |
| 2004/0100594 A1 | 5/2004 | Huibers et al. |
| 2004/0100680 A1 | 5/2004 | Huibers et al. |
| 2004/0124483 A1 | 7/2004 | Partridge et al. |
| 2004/0125281 A1 | 7/2004 | Lin et al. |
| 2004/0125347 A1 | 7/2004 | Patel et al. |
| 2004/0136045 A1 | 7/2004 | Tran |
| 2004/0140557 A1 | 7/2004 | Sun et al. |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard et al. |
| 2004/0150939 A1 | 8/2004 | Huff |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park et al. |
| 2004/0184766 A1 | 9/2004 | Kim et al. |
| 2004/0201908 A1 | 10/2004 | Kaneko |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichi et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0233503 A1 | 11/2004 | Kimura |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0002082 A1 | 1/2005 | Miles |
| 2005/0003667 A1 | 1/2005 | Lin et al. |
| 2005/0014374 A1 | 1/2005 | Partridge et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Vankata et al. |
| 2005/0078348 A1 | 4/2005 | Lin |
| 2005/0157364 A1 | 7/2005 | Lin |
| 2005/0168849 A1 | 8/2005 | Lin |
| 2005/0179378 A1 | 8/2005 | Oooka et al. |
| 2005/0195462 A1 | 9/2005 | Lin |
| 2005/0195467 A1 | 9/2005 | Kothari et al. |
| 2005/0202649 A1 | 9/2005 | Hung et al. |
| 2005/0249966 A1 | 11/2005 | Tung et al. |
| 2006/0007517 A1 | 1/2006 | Tsai |
| 2006/0017379 A1 | 1/2006 | Su et al. |
| 2006/0024880 A1 | 2/2006 | Chui et al. |
| 2006/0033975 A1 | 2/2006 | Miles |
| 2006/0044654 A1 | 3/2006 | Vandorpe et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066935 A1 | 3/2006 | Cummings |
| 2006/0067643 A1 | 3/2006 | Chui |
| 2006/0067649 A1 | 3/2006 | Tung et al. |
| 2006/0067651 A1 | 3/2006 | Chui |
| 2006/0077152 A1 | 4/2006 | Chui et al. |
| 2006/0077155 A1 | 4/2006 | Chui et al. |
| 2006/0077156 A1 | 4/2006 | Chui et al. |
| 2006/0077507 A1 | 4/2006 | Chui et al. |
| 2006/0077508 A1 | 4/2006 | Chui et al. |
| 2006/0077515 A1 | 4/2006 | Cummings et al. |
| 2006/0077516 A1 | 4/2006 | Kothari |
| 2006/0077527 A1 | 4/2006 | Cummings et al. |
| 2006/0077533 A1 | 4/2006 | Miles et al. |
| 2006/0079048 A1 | 4/2006 | Sampsell |
| 2006/0139723 A9 | 6/2006 | Miles |
| 2006/0220160 A1 | 10/2006 | Miles |
| 2006/0262126 A1 | 11/2006 | Miles |
| 2006/0262380 A1 | 11/2006 | Miles |
| 2006/0268388 A1 | 11/2006 | Miles |
| 2006/0274074 A1 | 12/2006 | Miles |
| 2007/0040777 A1 | 2/2007 | Cummings |
| 2007/0121118 A1 | 5/2007 | Gally et al. |
| 2007/0177247 A1 | 8/2007 | Miles |
| 2007/0194630 A1 | 8/2007 | Mingard et al. |

FOREIGN PATENT DOCUMENTS

| | | |
|---|---|---|
| DE | 4108966 A1 | 9/1992 |
| DE | 10228946 A1 | 1/2004 |
| EP | 0 310 176 A2 | 4/1989 |
| EP | 0 361 981 | 4/1990 |
| EP | 0 667 548 A1 | 8/1995 |
| EP | 0 788 005 | 8/1997 |
| EP | 1275997 | 1/2003 |

| | | |
|---|---|---|
| EP | 1 435 336 | 7/2004 |
| EP | 1 473 691 A | 11/2004 |
| EP | 1473581 A2 | 11/2004 |
| EP | 1 484 635 | 12/2004 |
| FR | 2 824 643 A | 11/2002 |
| JP | 62 082454 | 4/1987 |
| JP | 05275401 A1 | 10/1993 |
| JP | 9-127439 | 5/1997 |
| JP | 11211999 | 8/1999 |
| JP | 2000306515 A | 11/2000 |
| JP | 2001-221913 | 8/2001 |
| JP | 2002-062490 | 2/2002 |
| JP | 2002277771 A | 9/2002 |
| JP | 2003195201 A | 7/2003 |
| JP | 2004157527 A | 6/2004 |
| JP | 2004235465 A | 8/2004 |
| JP | 2004286825 A | 10/2004 |
| WO | WO 95/30924 | 11/1995 |
| WO | WO 97/17628 | 5/1997 |
| WO | WO 99/52006 A2 | 10/1999 |
| WO | WO 99/52006 A3 | 10/1999 |
| WO | WO 02/079853 | 10/2002 |
| WO | WO 03/007049 A1 | 1/2003 |
| WO | WO 03/014789 A2 | 2/2003 |
| WO | WO 03/054925 | 7/2003 |
| WO | WO 03/069404 | 8/2003 |
| WO | WO 03/069413 A1 | 8/2003 |
| WO | WO 03/073151 A1 | 9/2003 |
| WO | WO 03/085728 A1 | 10/2003 |
| WO | WO 2004/006003 A1 | 1/2004 |
| WO | WO 2004/026757 A2 | 4/2004 |
| WO | WO 2005/006364 A1 | 1/2005 |
| WO | WO 2006/014929 | 2/2006 |

OTHER PUBLICATIONS

Akasaka, "Three-Dimensional IC Trends", Proceedings of IEEE, vol. 74, No. 12, pp. 1703-1714, (Dec. 1986).
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Aratani K., et al., "Surface micromachined tuneable interferometer array," Sensors and Actuators, pp. 17-23. (1994).
Bass, "Handbook of Optics, vol. I, Fundamentals, Techniques, and Design, Second Edition," McGraw-Hill, Inc., New York, pp. 2.29-2.36 (1995).
Butler et al., "An Embedded Overlay Concept for Microsystems Packaging," IEEE Transactions on Advanced Packaging IEEE USA, vol. 23, No. 4, pp. 617-622, XP002379648 (2000).
Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.
Chunjun Wang et al., "Flexible curcuit-based RF MEMS Swithches," MEMS. XP002379649 pp. 757-762, (Nov. 2001).
Conner, "Hybrid Color Display Uing Optical Interference Filter Array," SID Digest, pp. 577-580 (1993).
Fan et al., "Channel Drop Filters in Photonic Crystals, "Optics Express, vol. 3, No. 1, 1998.
Fork, et al., "P-67: Chip on Glass Bonding using StressedMetal™ Technology" Sid 05 Digest, May 24, 2005.
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechnically-Active Anti-Reflection Layer with 1Mbit/sec Capability for Fiber-in-the-Loop Applications," IEEE Photonics Technology Letters, pp. 1119-1121 (Sep. 1994).

Goossen, "MEMS-based variable optical interference devices," Optical MEMS, 2000 IEEE/LEDS Int'l. Conf. on Aug. 21-24, 2000, Piscatawny, NJ, Aug. 21, 2000, pp. 17-18.
Gosch, "West Germany Grabs the Lead in X-Ray Lithography," Electronics pp. 78-80 (Feb. 5, 1987).
Howard et al., "Nanometer-Scale Fabrication Techniques", VLSI Electronics: Mictrostructure Science, vol. 5, pp. 145-153 and pp. 166-173 (1982).
IBBotson et al., "Comparison of XeF2 and F-atom reactions with Si and SiO2," Applied Physics Letters, vol. 44, No. 12, pp. 1129-1131 (Jun. 1984).
Jackson "Classical Electrodynamics", John Wiley & Sons Inc., pp. 568-573. (date unknown).
Jerman et al., "A Miniature Fabry-Perot Interferometer with a Corrugated Silicon Diaphragm Support", (1988).
Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.
Joannopoulos et al., "Molding the Flow of Light," Photonic Crystals. 1995.
Johnson "Optical Scanners", Microwave Scanning Antennas, vol. 1, pp. 251-261, (1964).
Kim et al., "Control of Optical Transmission Through metals Perforated With Subwave-Length Hole Arrays," Optic Letters, vol. 24, No. 4, Feb. 15, 1999, pp. 256-257.
Circle 36: Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1m Jan./Feb. 1999, pp. 4-9.
Little et al., "Vertically Coupled Microring Resonator Channel Dropping Filter," IEEE Photonics Technology Letters, vol. 11, No. 2, 1999.
Magel, "Integrated Optic Devices Using Micromachined Metal Membranes," SPIE vol. 2686, 0-8194-2060-Mar. 1996.
Miles, Mark, W., "A New Relective FPD Technology Using Interferometric Modulation", The Proceedings of the Society for Information Display (May 11-16, 1997).
Nagami et al., "Plastic Cell Architecture: Towards Reconfigurable Computing for General-Purpose," Proc. IEEE Workshop on FPGA-based Custom Computing Machines, (1998).
Newsbreaks, "Quantum-trench devices might operate at terahertz frequencies", Laser Focus World (May 1993).
Oliner et al., "Radiating Elements and Mutual Coupling", Microwave Scanning Antennas, vol. 2, pp. 131-141, (1966).
Peerlings et al., "Long Resonator Micromachined Tunable GaAs-A1As Fabry-Perot Filter," IEEE Photonics Technology Letters, IEEE Service Center, Piscatawny, NY, vol. 9, No. 9, Sep. 1997, pp. 1235-1237.
Raley et al., "A Fabry-Perot Microinterferometer for Visible Wavelengths", IEEE Solid-State Sensor and Actuator Workshop, Jun. 1992, Hilton Head, S.C.
Schnakenberg, et al. TMAHW Etchants for Silicon Micromachining. 1991 International Conference on Solid State Sensors and Actuators-Digest of Technical Papers. pp. 815-818.
Science and Technology, The Economist, May 22, 1999, pp. 89-90.
Sperger et al., "High Performance Patterned All-Dielectric Interference Colour Filter for Display Applications", SID Digest, pp. 81-83, (1994).
Stone, "Radiation and Optics, An Introduction to the Classical Theory", McGraw-Hill, pp. 340-343, (1963).
Walker, et al., "Electron-beam-tunable Interference Filter Spatial Light Modulator", Optics Letters vol. 13, No. 5, pp. 345-347, (May 1988).
Williams, et al. Etch Rates for Micromaching Processing. Journal of Microelectromechanical Systems, vol. 5, No. 4, pp. 256-259, (Dec. 1996).
Winters, et al., The etching of silicon with XeF2 vapor. Applied Physics Letters, vol. 34, No. 1, pp. 70-73, (Jan. 1979).
Winton, John M., "A novel way to capture solar energy", Chemical Week, (May 1985).

Wu, "Design of a Relective Color LCD Using Optical Interference Reflectors", ASIA Display '95, pp. 929-931, (Oct. 1995).

Wu et al., "MEMS Designed for Tunable Capacitors," Microwave Symposium Digest, 1998 IEEE MTT-S Int'l., Baltimore, MD, Jun. 7-12, 1998, vol. 1, pp. 127-129.

Zhou et al., "Waveguide Panel Display Using Electromechanical Spatial Modulators," SID Digest, vol. XXIX, 1998.

International Search Report and Written Opinion of the International Searching Authority for PCT/US2005/005919 dated Aug. 24, 2005.

International Search Report Application No. PCT/US2005/026448, dated Nov. 23, 2005.

International Search Report Application No. PCT/US2005/029820, Dated Dec. 27, 2005.

International Search Report Application No. PCT/US2005/030962, Dated Aug. 31, 2005.

International Search Reprot Application No. PCT/US2005/034465, Dated Sep. 23, 2005.

European Search Report Application No. 05255693.3-2217, dated May 24, 2006.

European Search Report Application No. EP 05 25 5673 in 9 pages, dated Jan. 23, 2006.

Austrian Search Report No. 162/2005, Dated Jul. 14, 2005.
Austrian Search Report No. 164/2005, Dated Jul. 4, 2005.
Austrian Search Report No. 140/2005, Dated Jul. 15, 2005.
Austrian Search Report No. 161/2005, Dated Jul. 15, 2005.
Austrian Search Report No. 150/2005, Dated Jul. 29, 2005.
Austrian Search Report No. 144/2005, Dated Aug. 11, 2005.
Austrian Search Report No. 66/2205, Dated May 9, 2005.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax |

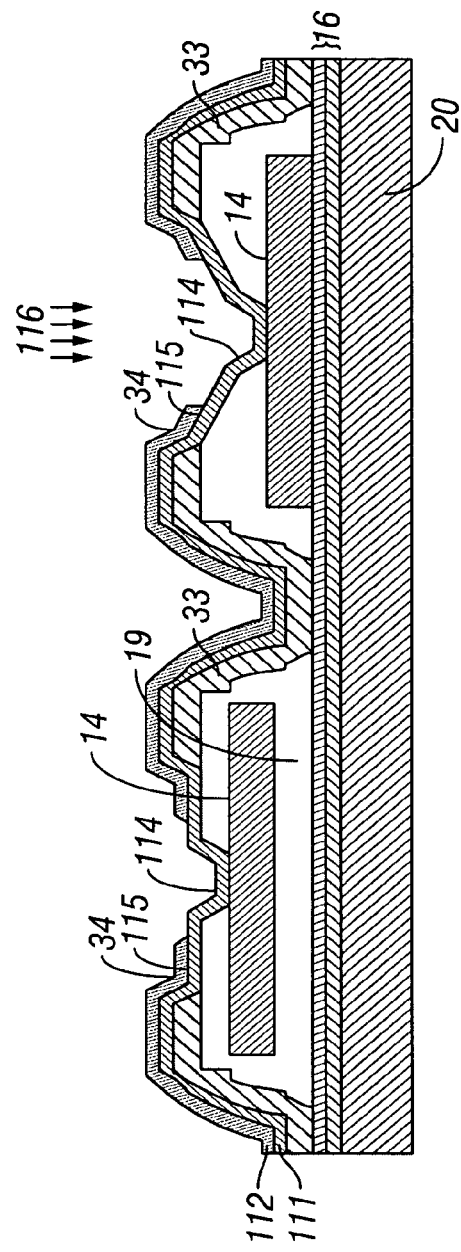
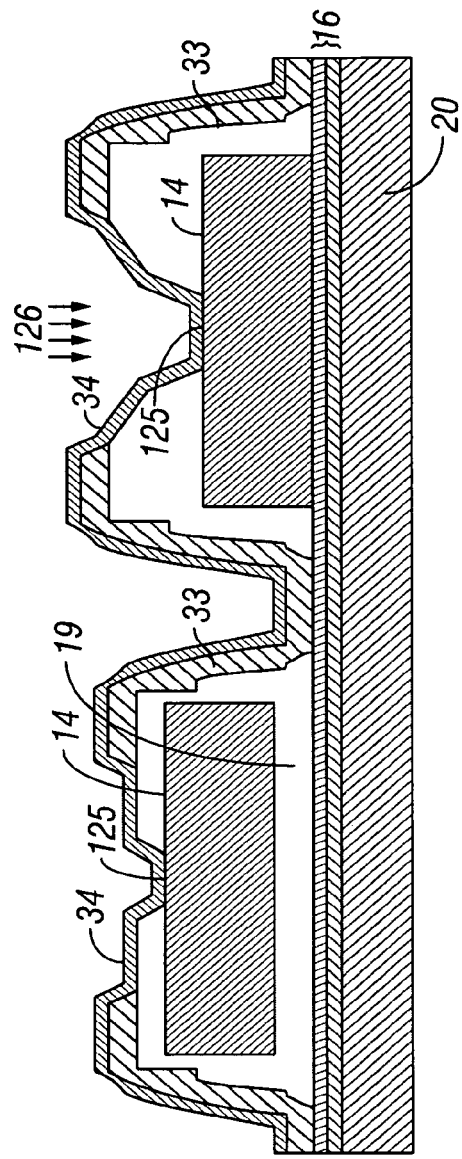
FIG. 11C
FIG. 12

SUPPORT STRUCTURE FOR FREE-STANDING MEMS DEVICE AND METHODS FOR FORMING THE SAME

BACKGROUND OF THE INVENTION

1. Field of the Invention

The field of the invention relates to microelectromechanical systems (MEMS).

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In certain embodiments, a microelectromechanical (MEMS) device comprises a functional layer and a deformable layer. The functional layer comprises a first material. The deformable layer comprises a second material. The second material is different from the first material. The deformable layer is mechanically coupled to the functional layer at a junction. The functional layer and the deformable layer have substantially equal internal stresses at the junction.

In certain embodiments, a microelectromechanical (MEMS) device comprises means for controlling a signal and means for supporting the controlling means. The controlling means comprises a first material. The supporting means comprises a second material. The second material is different from the first material. The supporting means is mechanically coupled to the controlling means at a junction. The controlling means and the supporting means have substantially equal internal stresses at the junction.

In certain embodiments, a method of manufacturing a microelectromechanical (MEMS) device on a substrate comprises forming a functional layer, forming a sacrificial layer over the functional layer, forming a hole in the sacrificial layer to expose a portion of the functional layer, and forming a deformable layer over the sacrificial layer. The functional layer comprises a first material. The sacrificial layer comprises sacrificial material. The deformable layer comprises a second material. The second material is different from the first material. The deformable layer is fused to the functional layer at a junction in the exposed portion of the functional layer. The functional layer and the deformable layer have substantially equal internal stresses at the junction.

BRIEF DESCRIPTION OF THE DRAWINGS

FIGS. 11A-11C depict cross-sectional views of yet another method of manufacturing an interferometric modulator with a reflective layer that is not curved and/or tilted.

FIG. 12 is a cross-section of an embodiment of an interferometric modulator with a reflective layer that is not curved and/or tilted.

DETAILED DESCRIPTION OF THE PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In certain embodiments, a junction of a deformable layer comprising a first material and a functional layer comprising a second material is provided. The functional layer and the deformable layer have substantially equal internal stresses at the junction. The lack of stress gradients at the junction decreases the curvature and/or tilt of the functional layer. Decreasing curvature and/or tilt is desirable, for example, to provide a substantially flat reflective layer and to make better contact or parallel spacing between electrodes. In some embodiments, the functional layer comprises a bilayer of a reflective or conductive material and a deformable material. In some embodiments, the functional layer comprises a graded composition (e.g., the first material having graded internal stresses or an alloy comprising the first material and the second material) that varies from a first side of the functional layer proximate to the deformable layer to a second side of the functional layer distal from the deformable layer. In some embodiments, the functional layer comprises a bilayer of a reflective or conductive material and a layer with a graded composition that varies from the reflective or conductive layer to the deformable layer.

Figure 1:
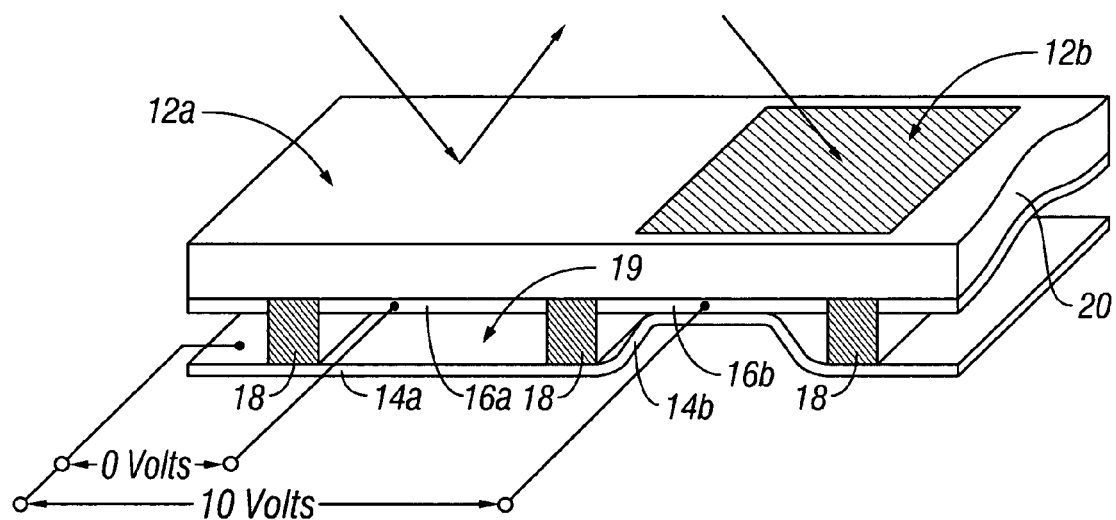
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together.

If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
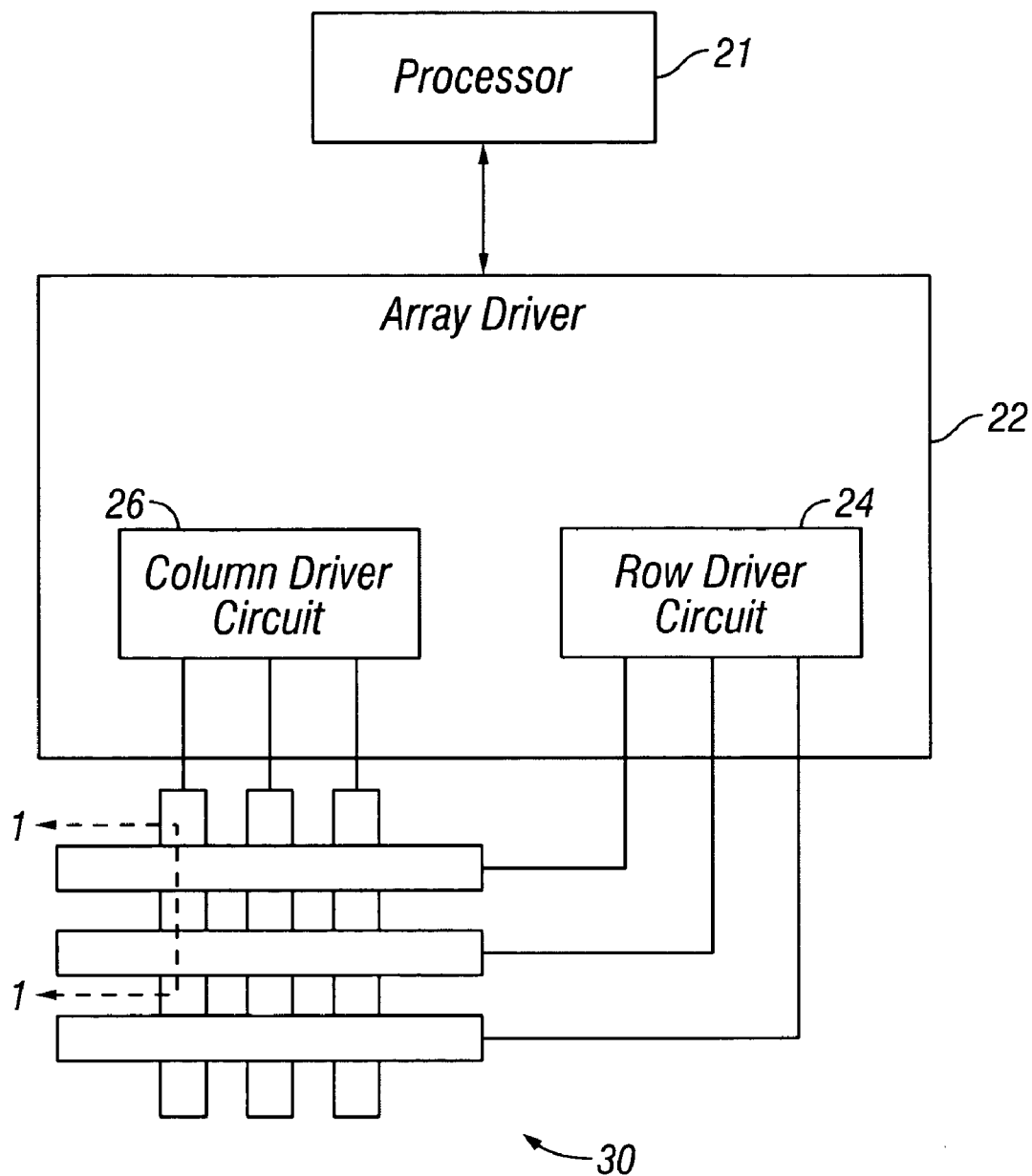
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
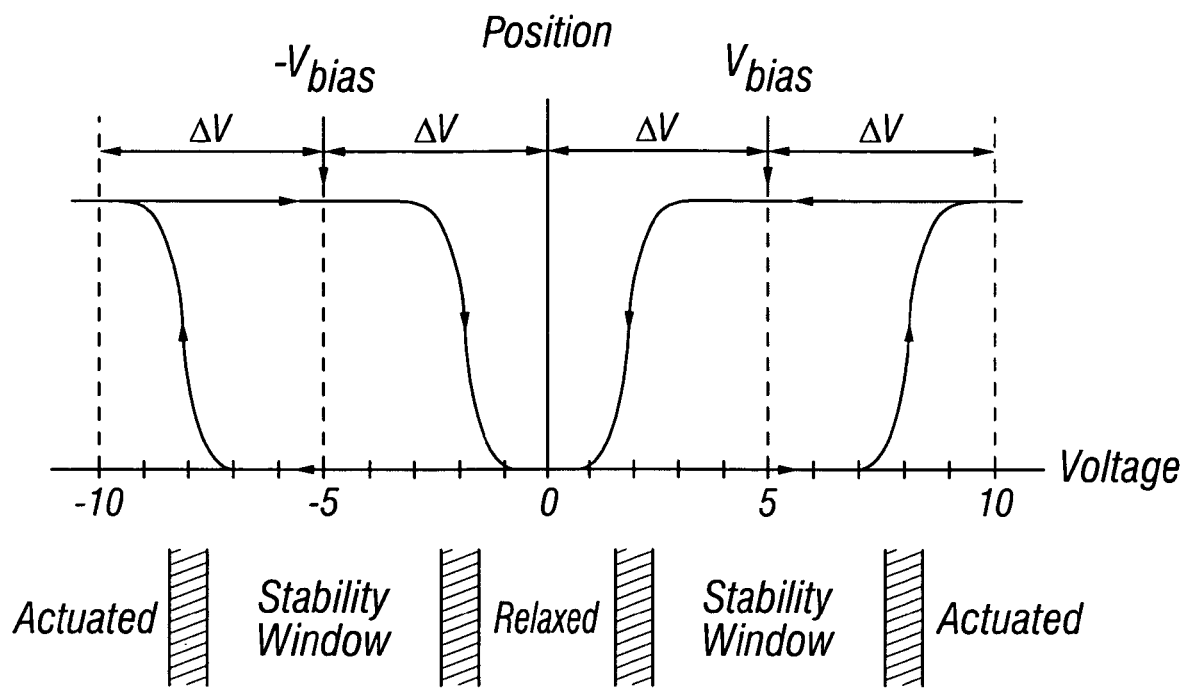
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
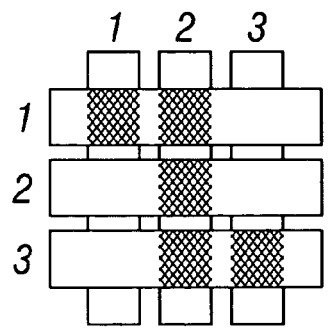
FIG. 5A illustrates one exemplary frame of display data in the 3×3 interferometric modulator display of FIG. 2.
Figure 5B:
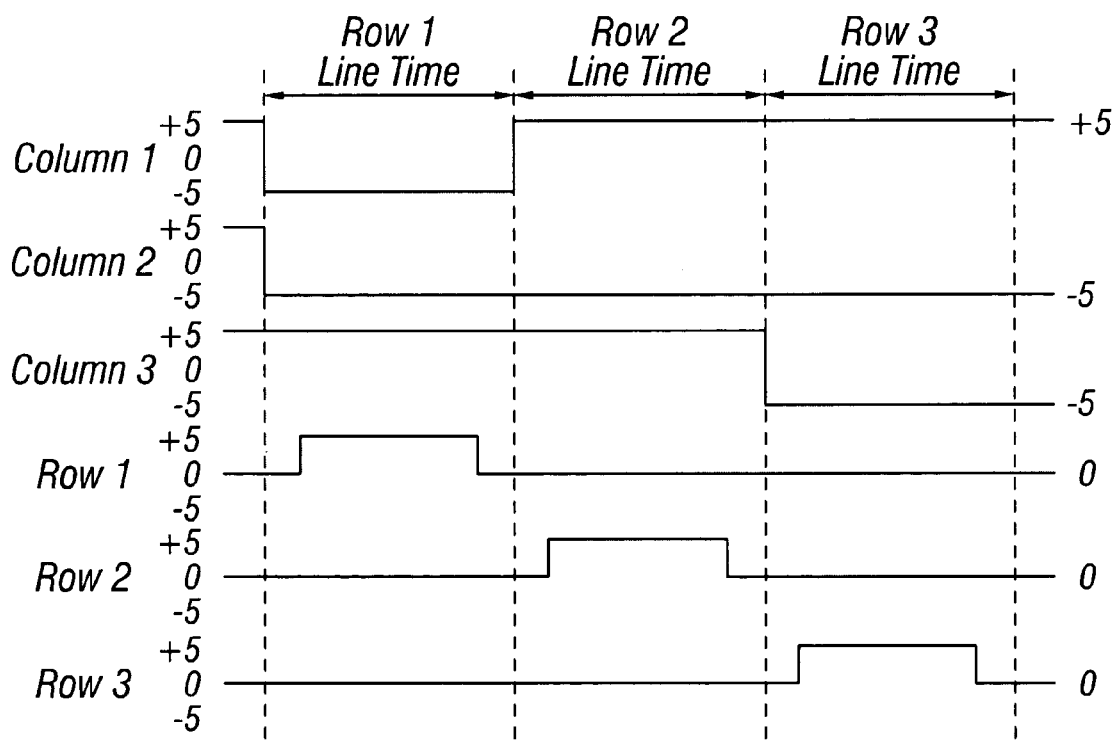
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
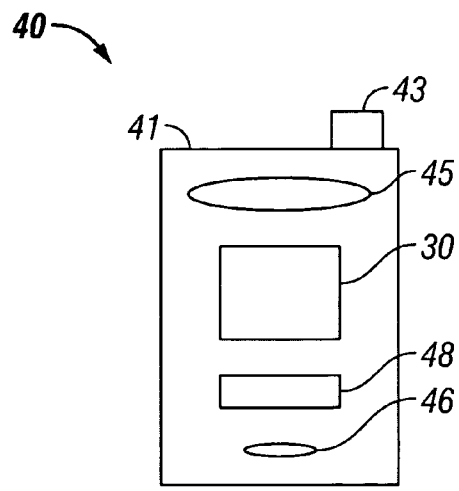
FIGS. 6A and 6B are system block diagrams illustrating an embodiment of a visual display device comprising a plurality of interferometric modulators.
Figure 6B:
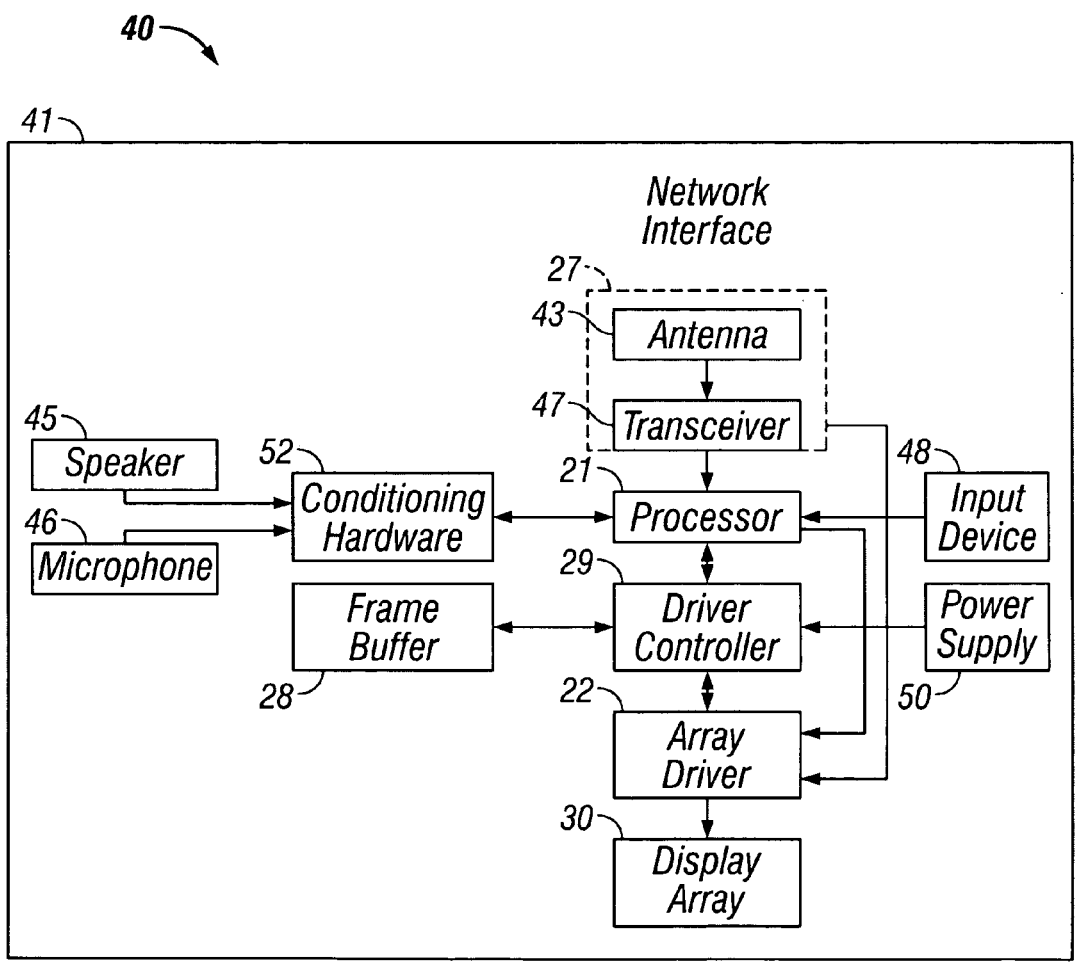

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22.

Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
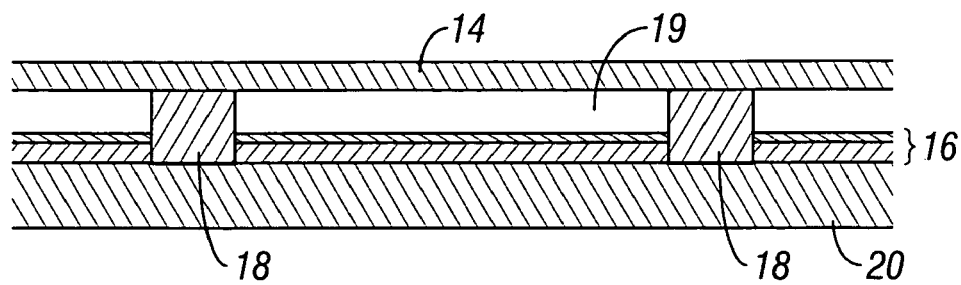
FIG. 7A is a cross section of the device of FIG. 1.
Figure 7B:
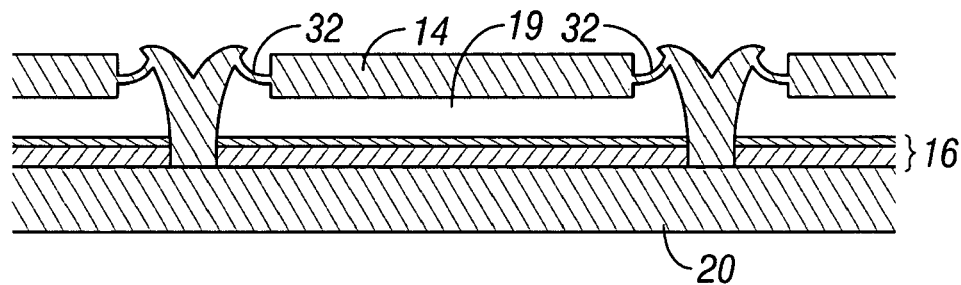
FIG. 7B is a cross section of an alternative embodiment of an interferometric modulator.
Figure 7C:
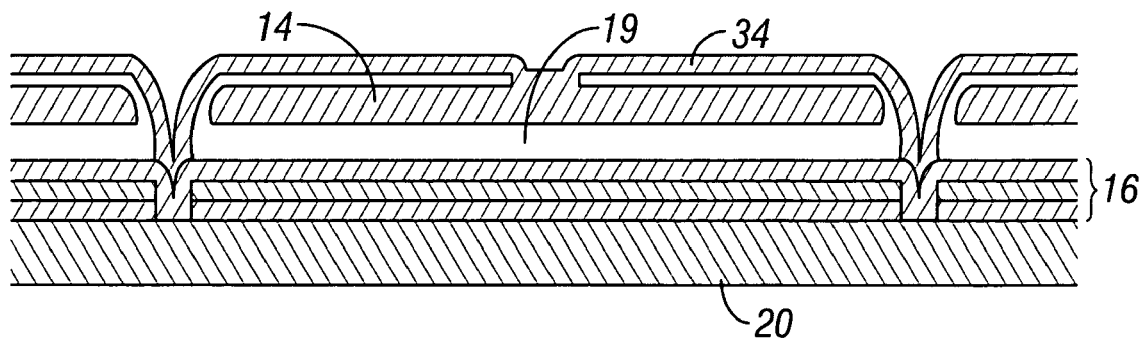
FIG. 7C is a cross section of another alternative embodiment of an interferometric modulator.
Figure 7D:
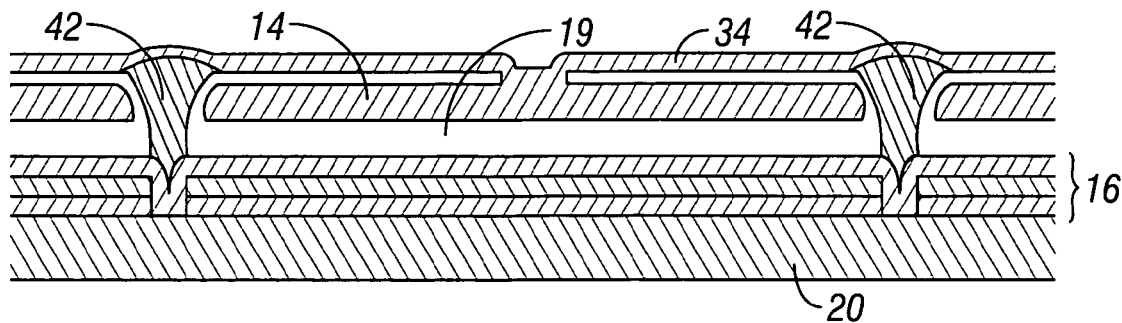
FIG. 7D is a cross section of yet another alternative embodiment of an interferometric modulator.
Figure 7E:
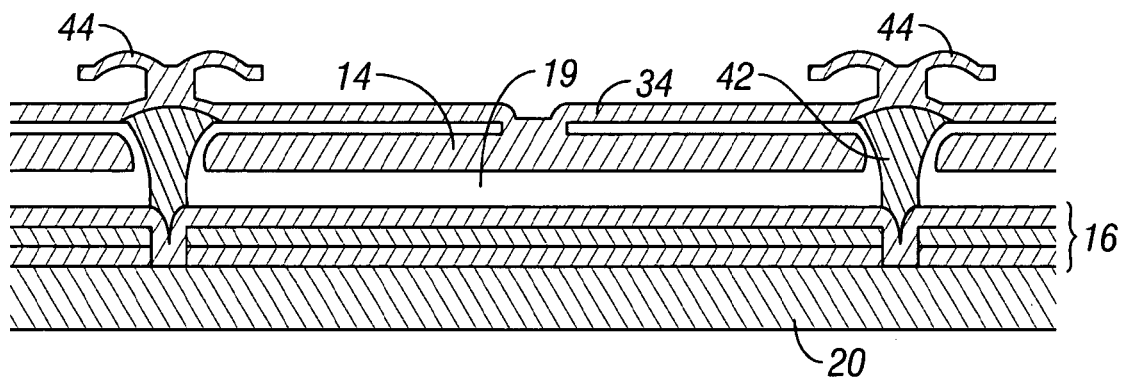
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
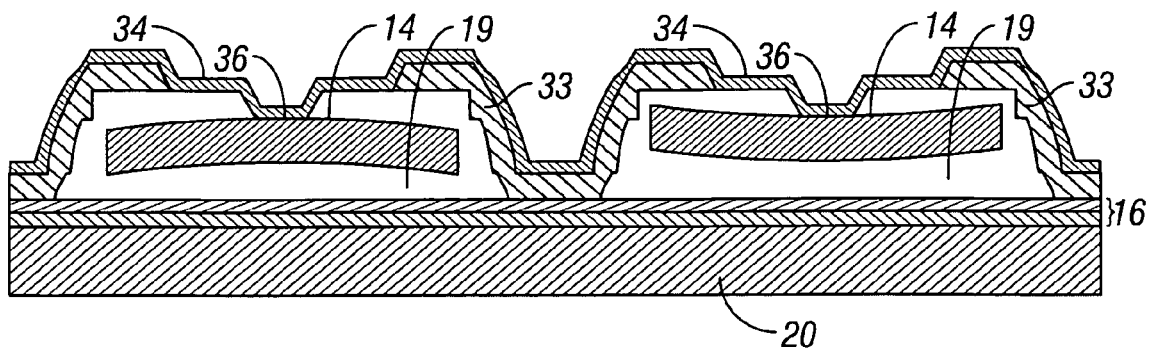
FIG. 8 is a cross section of an embodiment of an interferometric modulator with curved and/or tilted reflective layers.

Optimization of the structural design and materials used for the reflective layer (or "mirror layer") 14 and the deformable layer (or "mechanical layer") 34 may result in different materials being used for the reflective layer 14 and the deformable layer 34. Different materials may have different properties, such as residual stresses, which can cause curvature and/or tilt in the reflective layer 14. For example, crystalline nickel has an intrinsic crystal lattice stress of about 350 megapascals (MPa) and crystalline aluminum has an intrinsic crystal lattice stress of about 50 MPa. Because the residual stresses are different, an interface between nickel and aluminum will have a stress gradient, which will exert tensile or compressive forces, thereby causing curvature and/or tilt (or "launching" and "deflection") of the material that is more pliable or compliant (e.g., aluminum as compared to nickel). As illustrated in FIG. 8, the interface between different materials with mismatched crystal lattices for the reflective layer 14 and the deformable layer 34, for example aluminum and nickel, respectively, can cause curvature and/or tilt of the reflective layer 14. FIG. 8 generally corresponds to the embodiment depicted by FIG. 7C having different materials for the reflective layer 14 and the deformable layer 34. The use of different materials for the reflective layer 14 and the deformable layer 34 may also result in curvature and/or tilt of the reflective layer 14 in the embodiments depicted in FIGS. 7D and 7E, as well.

Another property that may be different between different materials is coefficient of thermal expansion. When a device comprising different materials for the reflective layer 14 and the deformable layer 34 is heated or cooled, thermal stresses due to different amounts of thermal expansion or contraction between the materials used for the reflective layer 14 and the deformable layer 34 can contribute to the curvature and/or tilt of the reflective layer 14. Thus, the magnitude of curvature and/or tilt is a function of temperature in some embodiments.

In certain embodiments, stress distribution in the reflective layer 14 is non-uniform because there is a stress gradient in the portion of the reflective layer 14 forming the interface 36, but there is no stress gradient in the other portions of the reflective layer 14. Thus, a smaller interface 36 between the deformable layer 34 and the reflective layer 14 can result in increasingly non-uniform stress distribution across the reflective layer 14, thereby increasing the curvature and/or tilt of the reflective layer 14.

Curvature and tilt of the reflective layer 14 may affect the size of the hysteresis window and the optical properties of the reflective layer 14. As described above, the row/actuation protocol may be set according to a hysteresis window, so a change in the hysteresis window may cause the device to function improperly or to fail.

Even if the device works within a given hysteresis window, the changed optical properties may adversely affect performance of a display comprising the device. Preferably, the surface of the reflective layer 14 facing the substrate 20 is substantially parallel to the optical stack 16. However, curvature and/or tilt of the reflective layer 14 may cause the surface of the reflective layer 14 facing the substrate 20 to become non-parallel to the optical stack 16. The reflective layer 14 may reflect differing amounts of visible light across its area, distorting whether the reflective layer 14 is in the "on" or "off" position.

In certain embodiments, the interface between the different materials for the reflective layer 14 and the deformable layer 34 is positioned away from the reflective layer 14, thereby decreasing the curvature and/or tilt of the reflective layer 14. The stress gradients due to residual stresses, coefficients of thermal expansion, and non-uniform stress distribution can thereby be positioned away from the reflective layer 14 or can be substantially eliminated.

Figure 9A:
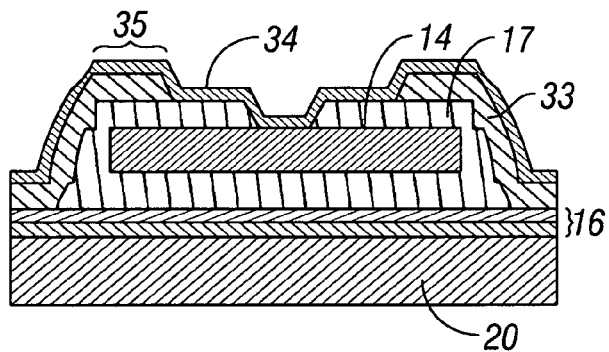
FIGS. 9A-9F depict cross-sectional views of one method of manufacturing an interferometric modulator with a reflective layer that is not curved and/or tilted.
Figure 9B:
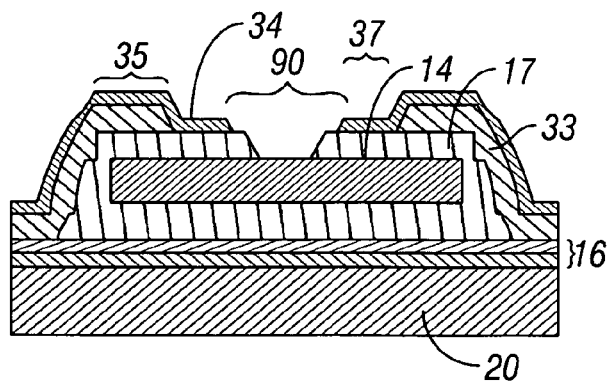
Figure 9C:
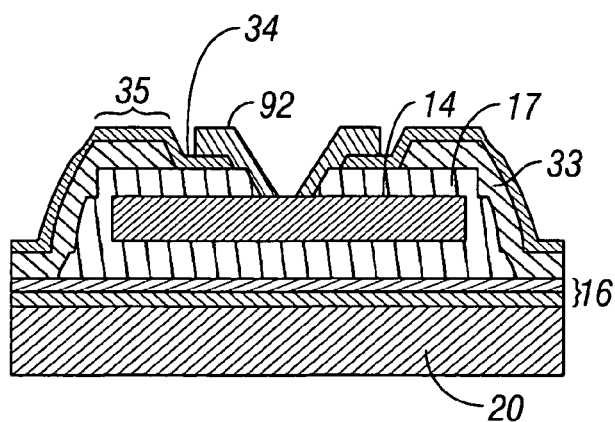
Figure 9D:
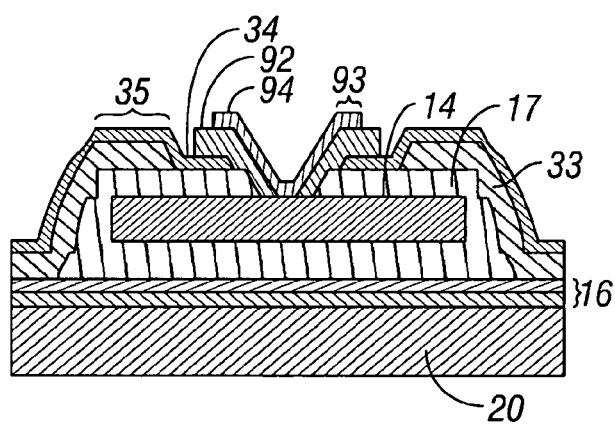
Figure 9E:
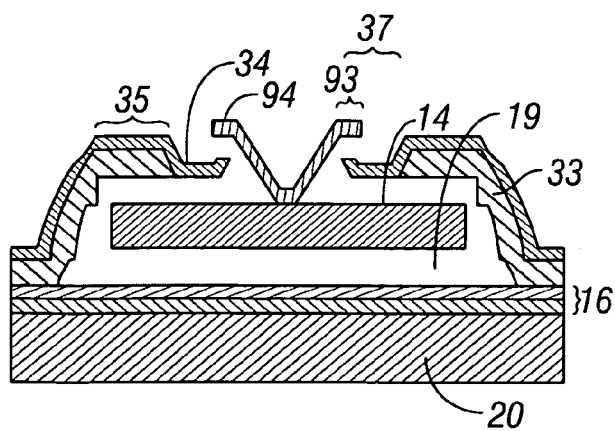
Figure 9F:
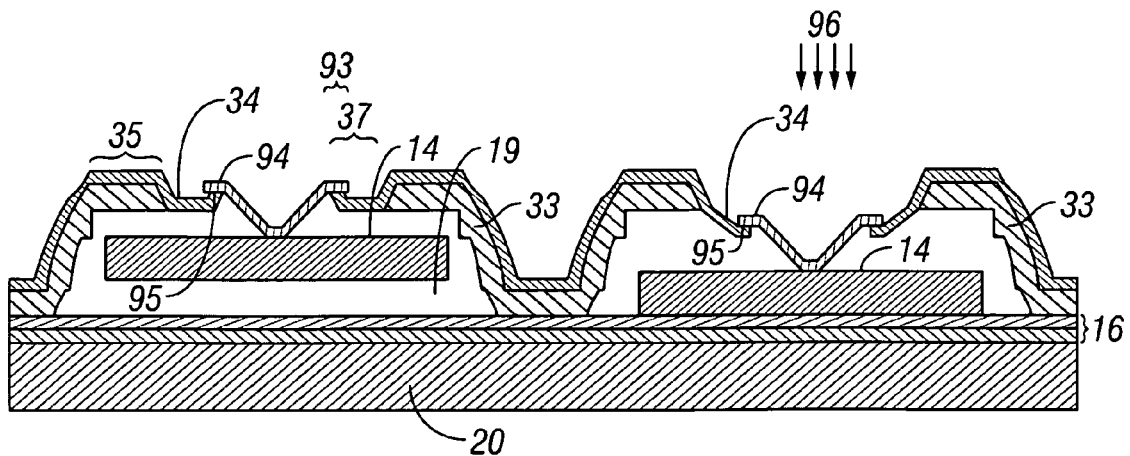

FIG. 9F depicts a cross-sectional view of a device in which the interface 95 between the different materials for the reflective layer 14 and the deformable layer 34 is spaced from the reflective layer 14. The reflective layer 14 comprises a first material. The first material is preferably optimized with respect to optical properties, such as being reflective to light. Examples of the first material that are reflective to light include, but are not limited to, silver, gold, copper, aluminum, and alloys thereof. The first material may be optimized with respect to optical properties, such as being reflective to ultraviolet (UV) or infrared (IR) light. Examples of the first material that are reflective to UV and/or IR light include, but are not limited to, zinc, platinum, rhodium, and titanium. The deformable layer 34 comprises a second material different from the first material. The second material is preferably optimized with respect to desired mechanical properties, such as being controllably deformable and providing suitable restoring forces. Examples of the second material include, but are not limited to, nickel, aluminum, aluminum alloys, chromium, nickel alloys (e.g., NiV), and iron.

In some embodiments, the deformable layer 34 is supported by support posts 33. The support posts 33 preferably comprise a rigid material that does not significantly deform. Examples of the rigid material include, but are not limited to, silicon oxide ($SiO_2$), silicon nitride ($SiN_x$), silicon oxynitride ($SiO_xN_y$), aluminum oxide ($Al_2O_3$), spin-on glass ("SOG"), and spin-on dielectric ("SOD"). In certain embodiments, the support posts 33 comprise a conductive material with an insulating material disposed between the support posts 33 and the deformable layer 34. Other configurations, such as those depicted in FIGS. 7D and 7E, may comprise other support posts 42 that support the deformable layer 34.

Referring again to FIG. 9F, the device further comprises a connecting element 94 mechanically coupled to the deformable layer 34 and the reflective layer 14. In certain embodiments, the connecting element 94 is fused to the reflective layer 14. In certain embodiments, the connecting element 94 comprises the first material. The connecting element 94 preferably comprises conductive material, for example, but not limited to, aluminum, although the connecting element 94 may comprise insulating or semiconductive material. The connecting element 94 may or may not comprise a deformable material. The connecting element 94 and the deformable layer 34 form an interface 95 between the first material and the second material. The interface 95 is spaced from the reflective layer 14.

In certain embodiments, the connecting element 94 does not comprise the first material, but comprises a material with a substantially similar intrinsic crystal lattice stress and/or coefficient of thermal expansion to the portion of the reflective element 14 to which the connecting element is mechanically coupled (e.g., fused). When the residual stresses and coefficient of thermal expansion are substantially similar, the stress gradients are mitigated or eliminated, thereby mitigating or eliminating curvature and/or tilt of the reflective layer 14.

In certain embodiments, neither the reflective layer 14 nor the connecting element 94 is fused to the deformable layer 34. As such, the reflective layer 14 and the connecting element 94 may be described as "floating." When a force such as gravity and/or an electrostatic force due to an electric field causes the reflective layer 14 and the connecting element 94 to move towards the substrate 20 (e.g., in the direction of the distributed electrostatic force due to an electric field schematically indicated by arrows 96), the portions 93 of the connecting element 94 that overlap the cantilevers 37 of the deformable layer 34 impede the reflective layer 14 from falling onto the optical stack 16. Upon activation, during which the cantilevers 37 of the deformable layer 34 are deflected, the reflective layer 14 is moved closer to the optical stack 16, as depicted on the right side of FIG. 9F. Upon relaxation, the electrostatic force due to an electric field is removed, and the deformable layer 34 returns to the relaxed state and the reflective layer 14 returns to the relaxed position, as depicted on the left side of FIG. 9F.

Once the connecting element 94 and the deformable layer 34 are in contact, adhesion forces (e.g., van der Waals forces) between the connecting element 94 and the deformable layer 34 keep the reflective layer 14 from moving translationally and keep the connecting element 94 from disconnecting from the deformable layer 34. A larger area of the interface 95 between the connecting element 94 and the deformable layer 34 results in stronger adhesion forces holding the connecting element 94 to the deformable layer 34. In some embodiments, the terminal edges of the cantilevers 37 of the deformable layer 34 near the interface 95 are curled downward or upward (e.g., as illustrated in FIG. 9F) due to the mismatched residual stresses between the materials of the connecting element 94 and the deformable layer 34. For example, in an embodiment in which the deformable layer 34 comprises nickel with tensile stress and the posts 33 comprise silicon dioxide with compressive stress, the terminal edges of the cantilevers 37 of the deformable layer 34 are curled upwards. The area of the interface 95 may depend on the width and profile of the cantilevers 37 of the deformable layer 34, the width and profile of the portions 93 of the connecting element 94, the materials used for the deformable layer 34 and the connecting element 94, photolithography critical dimension and alignment considerations, the smoothness of the top of the deformable layer 34 and the bottom of the connecting element 94, and other factors. The interface 95 in certain embodiments has an area between about 80 and 1,440 square microns, and in certain other embodiments has an area between about 144 and 512 square microns. Other areas of the interface 95 are also possible.

In certain embodiments, the interface 95 between the connecting element 94 and the deformable layer 34 is spaced from the interface between the posts 33 and the deformable layer 34. The rigidity of the posts 33 can impede the deformable layer 34 from deforming. In certain embodiments, the posts 33 have cantilever portions 35, and the sizes of these cantilever portions 35 of the posts 33 are minimized in order to increase the area available for the interface 95.

FIGS. 9A through 9F illustrate cross-sectional views of one method of manufacturing an interferometric modulator in accordance with certain embodiments described herein. It will be appreciated that some embodiments may add, delete, rearrange, change, substitute, or otherwise modify the processes described herein.

FIG. 9A depicts an interferometric modulator after the formation on a substrate 20 of an optical stack 16, a reflective layer 14 comprising a first material, a sacrificial layer 17 over the reflective layer 14, and a deformable layer 34 comprising a second material over the sacrificial layer 17. Removal of the sacrificial layer 17 at this point would result in the structure illustrated in FIG. 8. Because the reflective layer 14 and the deformable layer 34 may comprise different materials, this device may experience curvature and/or tilt of the reflective layer 14, as described above.

Alternative processing can result in interferometric modulators with reflective layers 14 that do not substantially experience curvature and/or tilt resulting from the use of different materials for the deformable layer 34 and the reflective layer 14. For example, in certain embodiments, a connecting element comprising the first material that is mechanically coupled (e.g., fused) to the reflective layer 14 is formed, and is mechanically coupled to the deformable layer 34 to form an interface between the first material and the second material that is spaced from the reflective layer 14.

FIG. 9B depicts the device of FIG. 9A after a hole 90 has been formed through the deformable layer 34 to uncover at least a portion of the reflective layer 14. Formation of the hole 90 also results in formation of the cantilevers 37 of the deformable layer 34 that at least partially extend beyond the cantilever portions 35 of the posts 33. In certain embodiments, the deformable layer 34 contacts the reflective layer 14 (as depicted by FIG. 9A) due to the formation of a hole through the sacrificial layer 17. The hole through the sacrificial layer 17 may be formed, for example, at the same time that the sacrificial layer 17 is patterned to define individual devices. The hole 90 may be formed by creating a pattern on top of the deformable layer 34 (e.g., with photoresist) and removing the portions of the deformable layer 34 not covered by the patterned material (e.g., by wet and/or dry etching). In embodiments in which the hole 90 has tapered sides through the deformable layer 34, removal of the deformable layer 34 is preferably performed by wet etching and/or anisotropic dry etching. In some embodiments, some of the sacrificial layer 17 is also removed.

In certain embodiments, no hole is formed in the sacrificial material 17 prior to deposition of the deformable layer 34. As such, the deformable layer 34 does not contact the reflective layer 14 (e.g., due to the sacrificial layer 17 remaining between the deformable layer 34 and the reflective layer 14). The hole 90 may be formed through both the deformable layer 34 and the sacrificial layer 17 by creating a pattern on top of the deformable layer 34 (e.g., with photoresist), removing the portions of the deformable layer 34 not covered by the patterned material (e.g., by wet and/or dry etching), and removing the portions of the sacrificial layer 17 under the removed portions of the mechanical layer 34 in the same or a subsequent removal process. In embodiments in which the hole 90 has tapered sides through the deformable layer 34 and the sacrificial layer 17, removal of the deformable layer 34 and/or the sacrificial layer 17 is preferably performed by wet etching and/or anisotropic dry etching.

FIG. 9C depicts the device of FIG. 9B after a sacrificial spacer 92 has been formed in the hole 90. Formation of the sacrificial spacer 92 leaves at least a portion of the reflective layer 14 uncovered such that materials deposited over the sacrificial spacer 92 may be mechanically coupled (e.g., fused) to the reflective layer 14. In certain embodiments, the sacrificial spacer 92 overlaps the cantilevers 37 of the deformable layer 34 but does not overlap the cantilever portions 35 of the posts 33. In certain embodiments, the sacrificial spacer 92 is formed by depositing the sacrificial spacer material (e.g., by chemical vapor deposition, physical vapor deposition, atomic layer deposition, etc.), creating a pattern on top of the sacrificial spacer material (e.g., with photoresist), and removing the portions of the sacrificial spacer not covered by the patterned material (e.g., by wet and/or dry etching).

FIG. 9D depicts the device of FIG. 9C after a connecting element 94 has been formed. The connecting element 94 is mechanically coupled (e.g., fused) to the reflective layer 14 at the portion of the reflective layer 14 not covered by the sacrificial spacer 92. The connecting element 94 includes portions 93 that at least partially overlap the cantilevers 37 of the deformable layer 34 but do not overlap the cantilever portions 35 of the posts 33. In certain embodiments, the connecting element 94 is formed by depositing the first material at least partially within the sacrificial spacer 92 and mechanically coupled (e.g., fused) to the reflective layer 14 (e.g., by chemical vapor deposition, physical vapor deposition, atomic layer deposition, etc.), creating a pattern on top of the first material (e.g., with photoresist), and removing the portions of the first material not covered by the patterned material (e.g., by wet and/or dry etching).

FIG. 9E depicts the device of FIG. 9D after the sacrificial layer 17 and the sacrificial spacer 92 have been removed. The connecting element 94 remains mechanically coupled (e.g., fused) to the reflective layer 14, but the connecting element 94 is not mechanically coupled to the deformable layer 34. In this state, the reflective layer 14 can be said to be "floating." In certain embodiments, the sacrificial layer 17 and/or the sacrificial spacer 92 are removed by etching (e.g., by wet and/or dry etching), either in the same process or in different processes. In some embodiments, the sacrificial layer 17 and the sacrificial spacer 92 are removed by etching with xenon difluoride ($XeF_2$). After removal of the sacrificial layer 17 and the sacrificial spacer 92, the stresses between the posts 33 and the deformable layer 34 can cause the more compliant material, typically the deformable layer 34, to experience launching and/or deflection. In certain embodiments, the launching and/or deflection can cause the edges of the cantilevers 37 curl upwards. Such curling of the edges of the cantilevers 37 can be advantageous because the cantilevers 37 may thereby make contact with the connecting element 93 when it is floating.

FIG. 9F depicts the device of FIG. 9E after the connecting element 94 has moved towards the substrate 20, for example due to gravity and/or an electrostatic force due to an electric field, thereby forming an interface 95 between the first material and the second material. When the connecting element 94 contacts the deformable layer 34, the connecting element 94 may adhere to the deformable layer 34 as described above. The resulting cavity 19 between the reflective layer 14 and the optical stack 16 provides space in which the reflective layer 14 can move between the actuated position and the relaxed position in response to the application of a voltage, as described above.

Figure 10A:
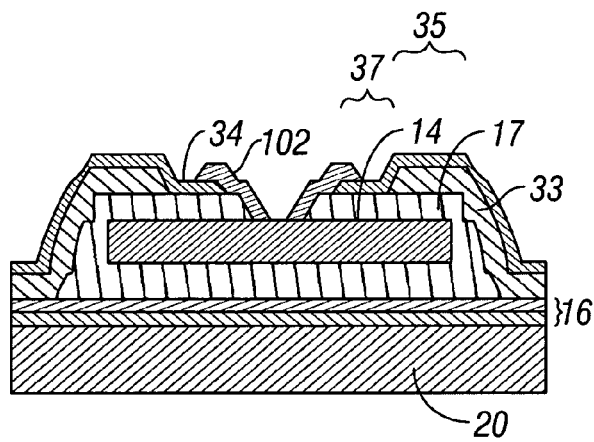
FIGS. 10A-10C depict cross-sectional views of another method of manufacturing an interferometric modulator with a reflective layer that is not curved and/or tilted.
Figure 10B:
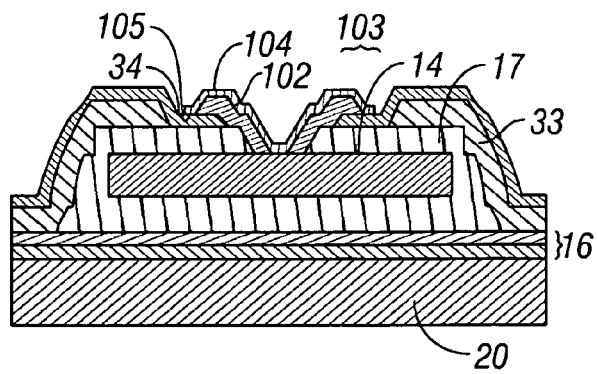
Figure 10C:
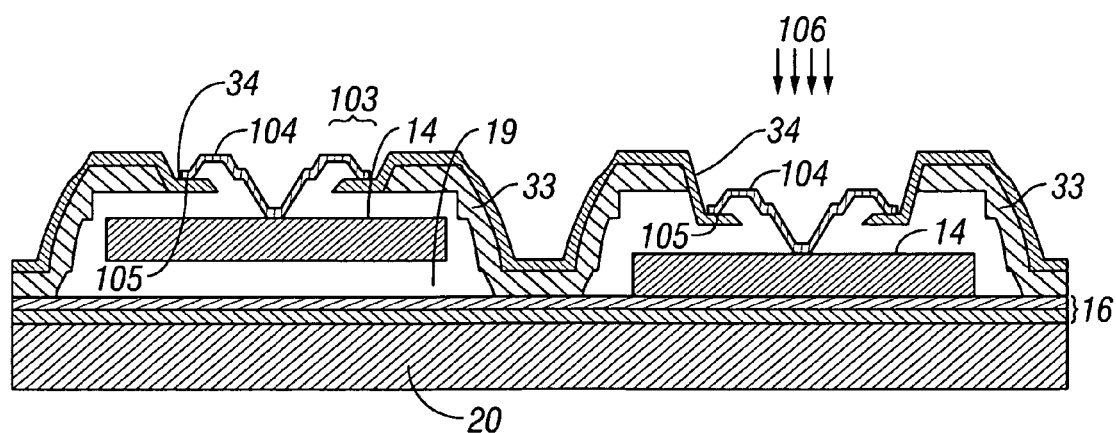

FIG. 10C depicts a cross-sectional view of another device in which an interface 105 between the different materials for the reflective layer 14 and the deformable layer 34 is spaced from the reflective layer 14. Unlike the embodiment depicted in FIG. 9F, the connecting element 104 is fused to the deformable layer 34 at the interface 105, so the area of the interface 105 is not optimized to maximize adhesion. The interface 105 in certain embodiments has an area between about 60 and 780 square microns, and in certain other embodiments has an area between about 80 and 275 square microns. Other areas of the interface 105 are also possible. Similar to the embodiment depicted in FIG. 9F, the interface 105 between the first material and the second material is spaced from the reflective layer 14.

When the reflective layer 14 is in a relaxed position, as depicted on the left side of FIG. 10C, the deformable layer 34 is in a relaxed state. When the reflective layer 14 is in an actuated position, as depicted on the right side of FIG. 10C, the deformable layer 34 is in a deformed state. The material that the deformable layer 34 comprises can be optimized to restorably deform when a force (e.g., in the direction of a distributed electrostatic force due to an electric field as schematically indicated by arrows 106) attracts the reflective layer 14 towards the substrate 20. When the force is removed, the deformable layer 34 returns to the relaxed state and the reflective layer 14 returns to the relaxed position.

FIGS. 10A through 10C illustrate cross-sectional views of another method of manufacturing an interferometric modulator in accordance with certain embodiments described herein. FIG. 10A depicts the device of FIG. 9B after a sacrificial spacer 102 has been formed in the hole 90. The sacrificial spacer 102 leaves at least a portion of the reflective layer 14 uncovered such that materials deposited over the sacrificial spacer 102 may be mechanically coupled (e.g., fused) with the reflective layer 14. In certain embodiments, the sacrificial spacer 102 overlaps the cantilevers 37 of the deformable layer 34 but does not overlap the cantilever portions 35 of the posts 33. In certain embodiments, the sacrificial spacer 102 is formed by depositing the sacrificial spacer material (e.g., by chemical vapor deposition, physical vapor deposition, atomic layer deposition, etc.), creating a pattern on top of the sacrificial spacer material (e.g., with photoresist), and removing the portions of the sacrificial spacer material not covered by the patterned material (e.g., by wet and/or dry etching).

FIG. 10B depicts the device of FIG. 10A after a connecting element 104 has been formed. The connecting element 104 is mechanically coupled (e.g., fused) to the reflective layer 14 at the portion of the reflective layer 14 not covered by the sacrificial spacer 102. The connecting element 104 overlaps the sacrificial spacer 102 such that the connecting element 104 is fused to the deformable layer 34 at the interface 105 between the first material and the second material. The connecting element 104 includes portions 103 that at least partially overlap the cantilevers 37 of the deformable layer 34 but do not overlap the cantilever portions 35 of the posts 33. In certain embodiments, the connecting element 104 is formed by depositing the first material at least partially within the sacrificial spacer 102 and mechanically coupled (e.g., fused) to the reflective layer 14 (e.g., by chemical vapor deposition, physical vapor deposition, atomic layer deposition, etc.), creating a pattern on top of the first material (e.g., with photoresist), and removing the portions of the first material not covered by the patterned material (e.g., by wet and/or dry etching).

FIG. 10C depicts the device of FIG. 10B after the sacrificial layer 17 and the sacrificial spacer 102 have been removed. The connecting element 104 remains mechanically coupled (e.g., fused) to the reflective layer 14 and fused to the deformable layer 34. In certain embodiments, the sacrificial layer 17 and/or the sacrificial spacer 102 are removed by etching (e.g., by wet etching), either in the same process or in different processes. The resulting cavity 19 between the reflective layer 14 and the optical stack 16 provides space in which the reflective layer 14 can move between the actuated position and the relaxed position in response to the application of a voltage, as described above.

FIG. 11C depicts a cross-sectional view of another device in which an interface 115 between the different materials for the reflective layer 14 and the deformable layer 34 is spaced from the reflective layer 14. Unlike the embodiments depicted in FIGS. 9F and 10C, the interface 115 between the connecting element 114 and the deformable layer 34 is below the deformable layer 34. Similar to the embodiment depicted in FIG. 10C, the connecting element 114 is fused to the deformable layer 34, so the area of the interface 115 is not optimized to maximize adhesion. Similar to the embodiment depicted in FIGS. 9F and 10C, the interface 115 between the first material and the second material is spaced from the reflective layer 14.

When the reflective layer 14 is in a relaxed position, as depicted on the left side of FIG. 11C, the deformable layer 34 is in a relaxed state. When the reflective layer 14 is in an actuated position, as depicted on the right side of FIG. 11C, the deformable layer 34 is in a deformed state. The second material 112 that the deformable layer 34 comprises can be optimized to restorably deform when a force (e.g., in the direction of a distributed electrostatic force due to an electric field as schematically indicated by arrows 116) attracts the reflective layer 14 towards the substrate 20. When the force is removed from the reflective layer 14, the deformable layer 34 returns to the relaxed state and the reflective layer 14 returns to the relaxed position.

Figure 11A:
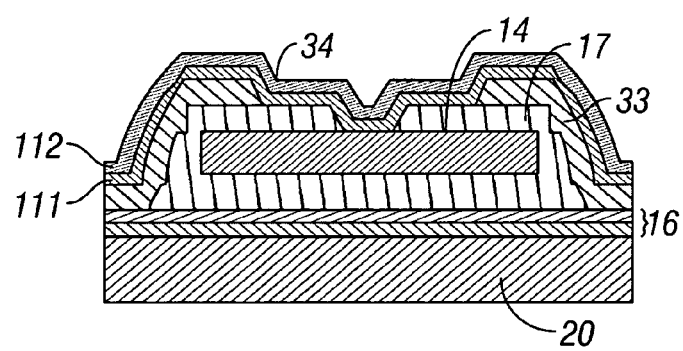
Figure 11B:
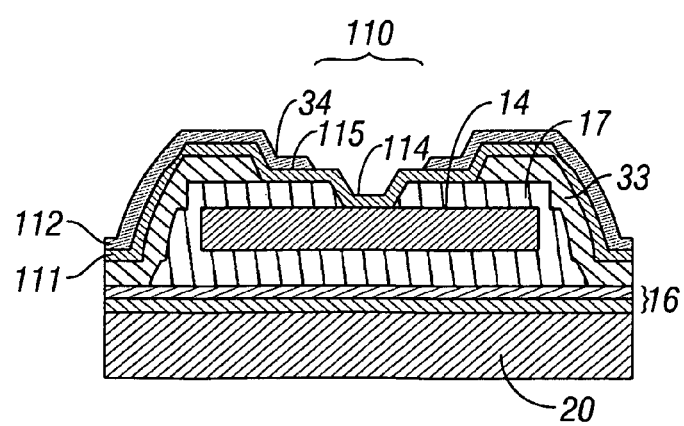

FIGS. 11A through 11C illustrate cross-sectional views of yet another method of manufacturing an interferometric modulator in accordance with certain embodiments described herein. FIG. 11A depicts an embodiment in which forming the deformable layer 34 and the connecting element 114 comprises depositing a first material 111 so that a portion of the first material 111 is mechanically coupled (e.g., fused) to the reflective layer 14 and depositing a second material 112 on top of the first material 111. In certain embodiments, the first material 111 comprises the same material as the first material of the reflective layer 14 and the second material 112 comprises the same material as the second material of the deformable layer 34. The first material 111 is mechanically coupled (e.g., fused) to the reflective layer 14. In certain embodiments, the first material 111 does not substantially overlap the entire structure of the posts 33 in order to increase the rigidity of the posts 33. For example, the first material 111 may be patterned such that the first material 111 overlaps the cantilever portions 35 of the posts 33 but not the other portions of the posts 33.

FIG. 11B depicts the device of FIG. 11A after a connecting element 114 has been formed. The connecting element 114 in the embodiment depicted by FIG. 11B is further formed by removing at least a portion of the second material 112 formed over the portion of the first material 111 that is mechanically coupled to the reflective layer 14. The interface 115 between the first material 111 and the second material 112 is below the deformable layer 34 and is spaced from the reflective layer 14. In certain embodiments, the connecting element 114 is formed by creating a pattern on top of the second material 112 (e.g., with photoresist) and removing the portions of the second material 112 not covered by the patterned material (e.g., by wet and/or dry etching). In some embodiments, removing the portions of the second material 112 not covered by the patterned material comprises selectively etching the second material 112 such that at least some of the first material 111 beneath the removed portions of the second material 112 remains. In some embodiments, the first material 111 is thick enough that the first material remains fused to the reflective layer 14 even if some of the first material 111 is removed. The remaining second material 112 is preferably spaced from the area where the first material 111 is fused to the reflective layer 14, but is also preferably large enough to provide suitable restoring forces.

FIG. 11C depicts the device of FIG. 11B after the sacrificial layer 17 has been removed. The connecting element 114 remains mechanically coupled (e.g., fused) to the reflective layer 14 and is fused to the second material 112. In certain embodiments, the sacrificial layer 17 is removed by etching (e.g., by wet etching). The resulting cavity 19 between the reflective layer 14 and the optical stack 16 provides space in which the reflective layer 14 to move between the actuated position and the relaxed position in response to the application of a voltage, as described above.

In certain embodiments, as schematically illustrated by FIG. 12, the thickness of the reflective layer 14 is selected so that the stress gradients due to residual stresses, coefficients of thermal expansion, and non-uniform stress distribution do not cause significant curvature and/or tilt of the reflective layer 14. In some embodiments, a thickness of more than about one micron is advantageously used. While FIG. 12 depicts a configuration in which the interface 125 between the first material and the second material is adjacent to the reflective layer 14, in certain embodiments, the thickness of the reflective layer 14 is selected to reduce any curvature and/or tilt of the reflective layer 14 in configurations as described above with the interface spaced from the reflective layer 14.

When the reflective layer 14 is in a relaxed position, as depicted on the left side of FIG. 12, the deformable layer 34 is in a relaxed state. When the reflective layer 14 is in an actuated position, as depicted on the right side of FIG. 12, the deformable layer 34 is in a deformed state. The deformable layer 34 deforms when a force (e.g., in the direction of a distributed electrostatic force due to an electric field as schematically indicated by arrows 126) attracts the reflective layer 14 towards the substrate 20. When the force is removed from the reflective layer 14, the deformable layer 34 returns to the relaxed state and the reflective layer 14 returns to the relaxed position.

In certain embodiments, the reflective layer 14 comprises a first material and the deformable layer 34 comprises a second material different from the first material. The reflective layer 14 and the deformable layer 34 form a junction, and the reflective layer 14 and the deformable layer 34 have substantially equal internal stresses at the junction. As used herein, the term "substantially equal internal stresses" is to be given its broadest possible meaning, including, but not limited to, internal stresses that are similar enough that the curvature and/or tilt of the reflective layer 14 is suitably decreased. The substantial equality of the internal stresses depends on factors such as materials, thicknesses, contact area, and coefficients of thermal expansion. In certain embodiments, the difference in internal stresses between the reflective layer 14 and the deformable layer 34 that is substantially equal at the junction is less than about 150 MPa, less than about 60 MPa, and less than about 10. It will be appreciated that substantially equal may also mean that the internal stresses are the same, for example and without limitation when the reflective layer 14 and the deformable layer 34 comprise the same material at the junction. In some embodiments, the reflective layer 14 and the deformable layer 34 have substantially equal coefficients of thermal expansion at the junction.

Figure 13:
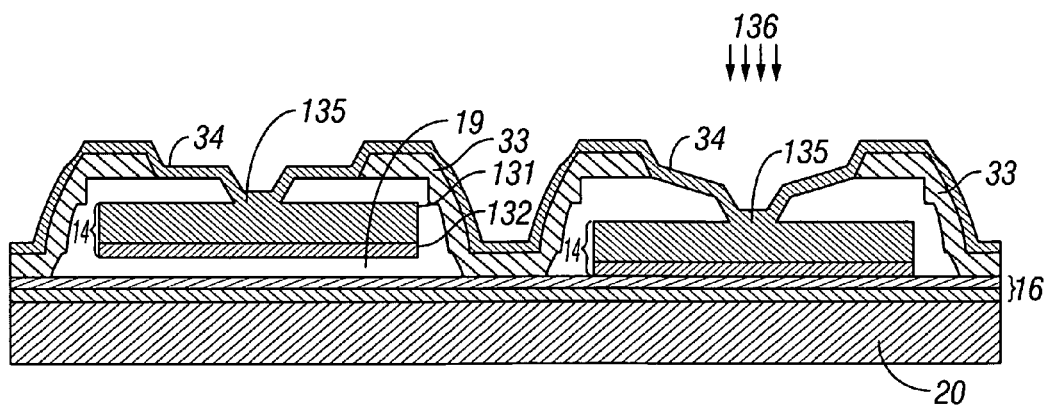
FIG. 13 is a cross-section of another embodiment of an interferometric modulator with a reflective layer that is not curved and/or tilted.

FIG. 13 depicts a cross-sectional view of an embodiment of a device in which the reflective layer 14 comprises a first material and in which the deformable layer 34 comprises a second material different from the first material. The deformable layer 34 is mechanically coupled to the reflective layer 14 at a junction 135. The reflective layer 14 and the deformable layer 34 have substantially equal internal stresses at the junction 135. The reflective layer 14 comprises a reflective layer 132 on a side of the reflective layer 14 facing away from the deformable layer 34.

In some embodiments, the reflective layer 14 comprises a bilayer comprising a reflective layer 132 comprising the first material on a side of the reflective layer 14 facing away from the deformable layer 34 and a layer 131 of the second material. At the junction 135, the deformable layer 34 comprises the second material and the reflective layer 14 comprises the second material, so the internal stresses of the deformable layer 34 and the reflective layer 14 are substantially equal. In certain embodiments, the first material comprises aluminum and the second material comprises nickel. The term "bilayer" is not to be limiting, and the reflective layer 14 may comprise more than two layers, for example by inserting a third layer between the reflective layer 132 and the layer 131 of the second material. Although there may be some stress gradients at an interface between the reflective layer 132 and the layer 131 of the second material within the reflective layer 14, the reflective layer 132 is thin compared to the layer 131 of the second material. In some embodiments, the reflective layer 132 comprises less than about 20%, less than about 10%, or less than about 3% of the thickness of the reflective layer 14. In certain embodiments, formation of the bilayer comprises deposition of the reflective layer 132 and deposition of the layer 131 of the second material over the reflective layer 132.

When the reflective layer 14 is in a relaxed position, as depicted on the left side of FIG. 13, the deformable layer 34 is in a relaxed state. When the reflective layer 14 is in an actuated position, as depicted on the right side of FIG. 13, the deformable layer 34 is in a deformed state. The second material can be optimized to restorably deform when a force (e.g., in the direction of a distributed electrostatic force due to an electric field as schematically indicated by arrows 136) attracts the reflective layer 14 towards the substrate 20. When the force is removed from the reflective layer 14, the deformable layer 34 returns to the relaxed state and the reflective layer 14 returns to the relaxed position (e.g., as illustrated on the left side of FIG. 13).

Figure 14:
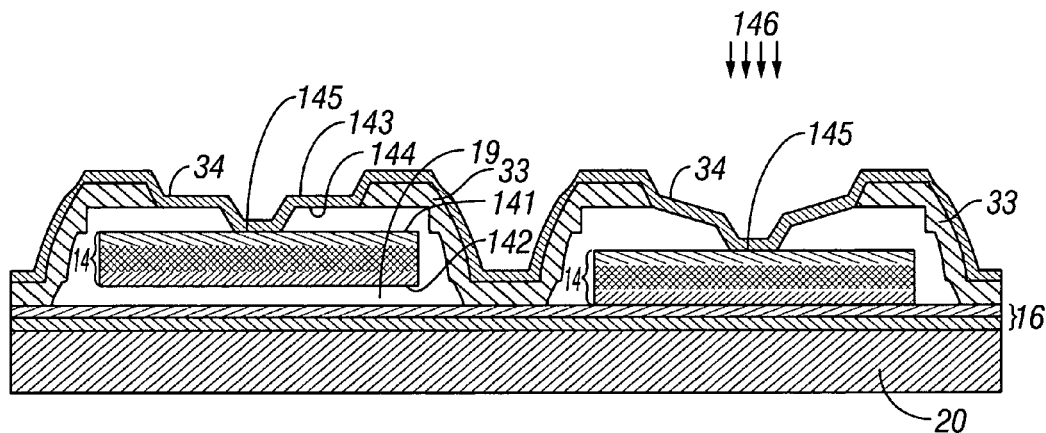
FIG. 14 is a cross-section of yet another embodiment of an interferometric modulator with a reflective layer that is not curved and/or tilted.

FIG. 14 depicts a cross-sectional view of another embodiment of a device in which the reflective layer 14 comprises a first material and in which the deformable layer 34 comprises a second material different from the first material. The deformable layer 34 is mechanically coupled to the reflective layer 14 at a junction 145. The reflective layer 14 and the deformable layer 34 have substantially equal internal stresses at the junction 145. The reflective layer 14 has a graded composition that varies from a first side 141 proximate to the deformable layer 34 to a second side 142 of the reflective layer 14 distal from the deformable layer 34. As used herein, the term "graded" is to be given its broadest possible definition, including, but not limited to, having a composition that varies generally continuously (e.g., linearly, non-linearly) across its thickness and having a composition that varies in a step-wise manner or non-continuously across its thickness. The reflective layer 14 is reflective at the second side 142 of the reflective layer 14.

In certain embodiments, the reflective layer 14 comprises the first material throughout its thickness, and the internal stress of the first material is modified during deposition by varying at least one deposition parameter such that the internal stresses of the reflective layer 14 and the deformable layer 34 at the junction 145 are substantially equal. Examples of deposition parameters that may be varied to modify the properties of the reflective layer 14 include, but are not limited to, temperature, pressure, power, deposition duration, the first material precursors, and the flowrate of the first material precursors.

As an example, in an embodiment in which the first material comprises aluminum and the deformable layer 34 comprises nickel with an internal crystal lattice stress of 350 MPa at the junction 145, the reflective layer 14 may comprise the first material with a first intrinsic crystal lattice stress of 50 MPa at the second side 142 and a second intrinsic crystal lattice stress of 300 MPa at the first side 141. At the junction 145, the deformable layer 34 has an internal stress of 350 MPa and the reflective layer 14 has an internal stress of 300 MPa, so the internal stresses are substantially equal, in this embodiment with a difference of 50 MPa.

In certain embodiments, the properties of the deformable layer 34 are modified during deposition by varying at least one deposition parameter. As an example, in an embodiment in which the second material comprises nickel and the reflective layer 14 comprises aluminum with an internal crystal lattice stress of 50 MPa at the junction 145, the deformable layer 34 may comprise the second material with a first intrinsic crystal lattice stress of 350 MPa at a first side 143 distal from the reflective layer 14 and a second intrinsic crystal lattice stress of 100 MPa at a second side 144 proximate to the reflective layer 14. At the junction 145, the deformable layer 34 has an internal stress of 100 MPa and the reflective layer 14 has an internal stress of 50 MPa, so the internal stresses are substantially equal, in this embodiment with a difference of 50 MPa.

In certain embodiments, the properties of both the reflective layer 14 and the deformable layer 34 are modified during deposition. As an example, the reflective layer 14 may comprise the first material comprising aluminum with a first intrinsic crystal lattice stress of 50 MPa at the first side 141 and a second intrinsic crystal lattice stress of 200 MPa at the second side 142, and the deformable layer 34 may comprise the second material comprising nickel with an intrinsic crystal lattice stress of 350 MPa at the first side 143 and an intrinsic crystal lattice stress of 200 MPa at the second side 144. At the junction 145, the deformable layer 34 has in internal stress of 200 MPa and the reflective layer 14 has an internal stress of 200 MPa, so the internal stresses are substantially equal, in this embodiment with a difference of zero MPa.

In certain embodiments, the reflective layer 14 with a graded composition comprises an alloy. In certain embodiments, the alloy comprises at least one element of the second material. For example, the alloy may comprise the first material comprising a reflective material and the second material comprising a deformable material. The reflective layer 14 comprises substantially all reflective first material on a side 142 of the reflective layer 14 facing away from the deformable layer 34 and substantially all deformable second material on a side 141 proximate to the junction 145 of the reflective layer 14 and the deformable layer 34. The deformable layer 34 comprises the deformable second material, so the reflective layer 14 and the deformable layer 34 have substantially equal internal stresses at the junction 145.

In certain embodiments, the second side 142 of the reflective layer 14 comprises substantially all aluminum and the first side 141 of the reflective layer 14 comprises substantially all nickel, with the ratio of aluminum to nickel decreasing within the reflective layer 14 from the second side 142 to the first side 141. The graded composition of the reflective layer 14 may comprise different ratios of the first material to the second material by altering deposition parameters, for example, but not limited to, temperature, pressure, power, first and second material precursors, and the ratio of the flowrates of the first and second material precursors. For example, the precursors may comprise substantially all first material precursor, then an increasing amount of second material precursor and a decreasing amount of first material precursor, then substantially all second material precursor. For another example, the precursors may comprise substantially all first material precursor, then an increasing amount of second material precursor with a constant amount of first material precursor, then substantially all second material precursor. In certain embodiments, the second side 142 comprises aluminum with an intrinsic crystal lattice stress of 50 MPa and the first side 141 comprises nickel with an intrinsic crystal lattice stress of 350 MPa.

When the reflective layer 14 is in a relaxed position, as depicted on the left side of FIG. 14, the deformable layer 34 is in a relaxed state. When the reflective layer 14 is in an actuated position, as depicted on the right side of FIG. 14, the deformable layer 34 is in a deformed state. The second material can be optimized to restorably deform when a force (e.g., in the direction of a distributed electrostatic force due to an electric field as schematically indicated by arrows 146) attracts the reflective layer 14 towards the substrate 20. When the force is removed from the reflective layer 14, the deformable layer 34 returns to the relaxed state and the reflective layer 14 returns to the relaxed position (e.g., as illustrated on the left side of FIG. 14).

Figure 15:
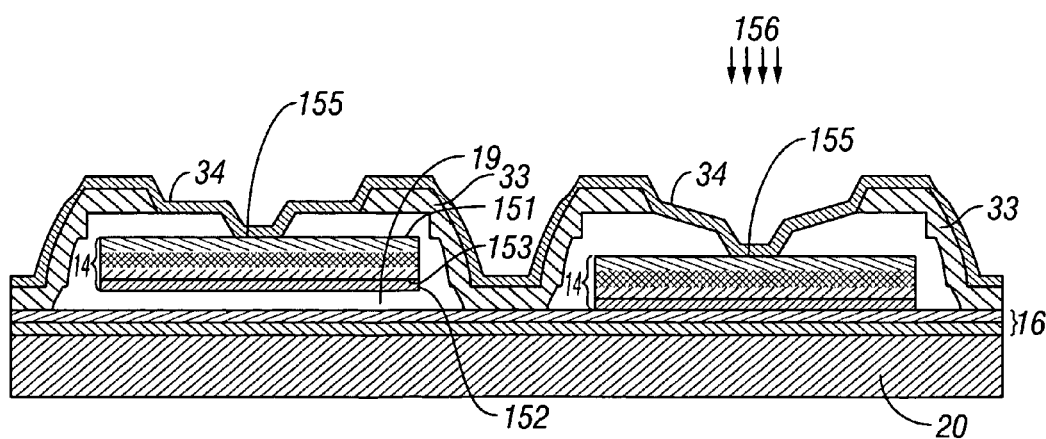
FIG. 15 is a cross-section of still another embodiment of an interferometric modulator with a reflective layer that is not curved and/or tilted.

The curvature and/or tilt of the reflective layer 14 may also be decreased by using combinations of the embodiments of FIGS. 13 and 14 (e.g., a bilayer with one or both layers having a graded composition). FIG. 15 depicts a cross-sectional view of yet another embodiment of a device in which the reflective layer 14 comprises a first material and in which the deformable layer 34 comprises a second material different from the first material. The reflective layer 14 comprises a reflective layer 152, for example comprising aluminum with an intrinsic crystal lattice stress of 50 MPa. The deformable layer 34 comprises, for example, nickel with an intrinsic crystal lattice stress of 350 MPa. The reflective layer 14 further comprises a graded composition having an intrinsic crystal lattice stress of 50 MPa at a side 153 distal to the junction of the reflective layer 14 and the deformable layer 34 and an intrinsic crystal lattice stress of 300 MPa at a side 151 proximate to the junction of the reflective layer 14 and the deformable layer 34. The junction of the reflective layer 14 and the deformable layer 34 comprises materials having substantially similar internal stresses. Such an embodiment advantageously allows any thickness of the reflective layer 152 in comparison to the thickness of the reflective layer 15.

When the reflective layer 14 is in a relaxed position, as depicted on the left side of FIG. 15, the deformable layer 34 is in a relaxed state. When the reflective layer 14 is in an actuated position, as depicted on the right side of FIG. 15, the deformable layer 34 is in a deformed state. The second material can be optimized to restorably deform when a force (e.g., in the direction of a distributed electrostatic force due to an electric field as schematically indicated by arrows 156) attracts the reflective layer 14 towards the substrate 20. When the force is removed from the reflective layer 14, the deformable layer 34 returns to the relaxed state and the reflective layer 14 returns to the relaxed position.

Other MEMS devices, for example switches, may also benefit from the optimization of the structural design and materials used to form the device, and may result in different materials being used for a deformable layer and a functional layer connected to the deformable layer that is preferably flat. Similar to the reflective layer in interferometric modulators, the use of different materials that have different properties can cause curvature and/or tilt in the functional layer.

Figure 16A:
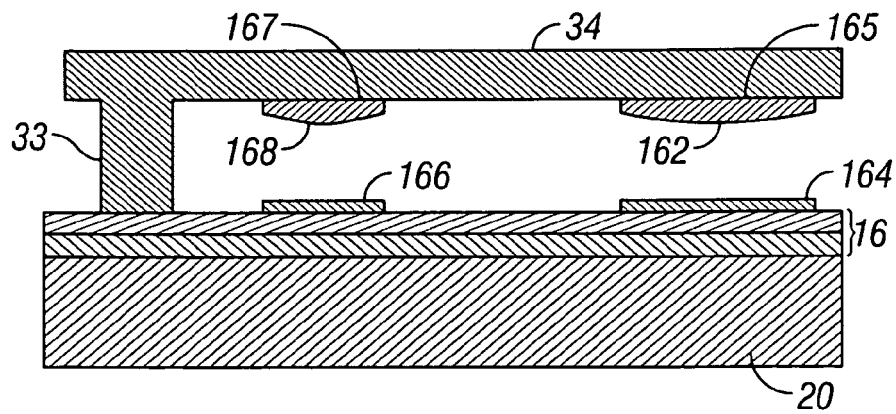
FIGS. 16A-16D depict cross-sectional views of an example switch with a contact layer that is curved and/or tilted.
Figure 16B:
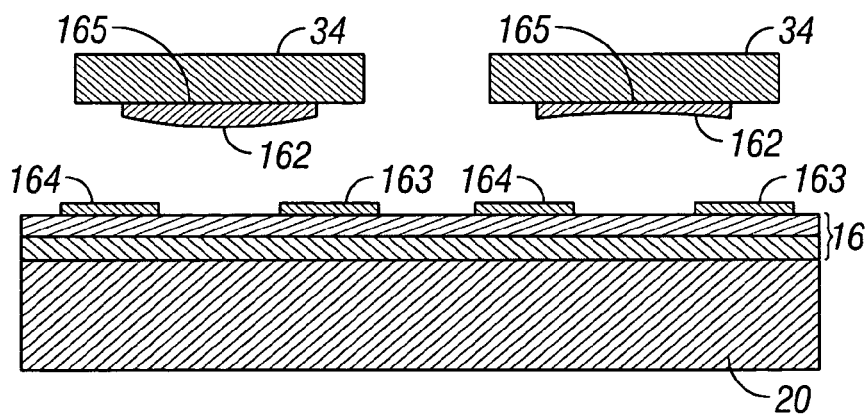
Figure 16C:
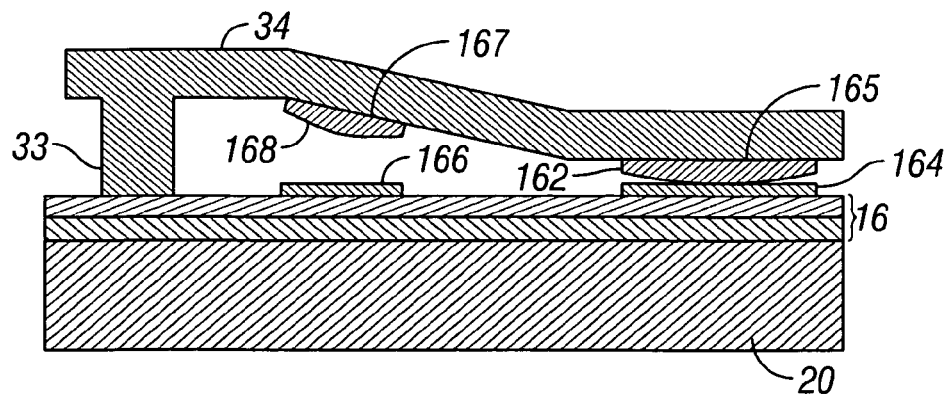
Figure 16D:
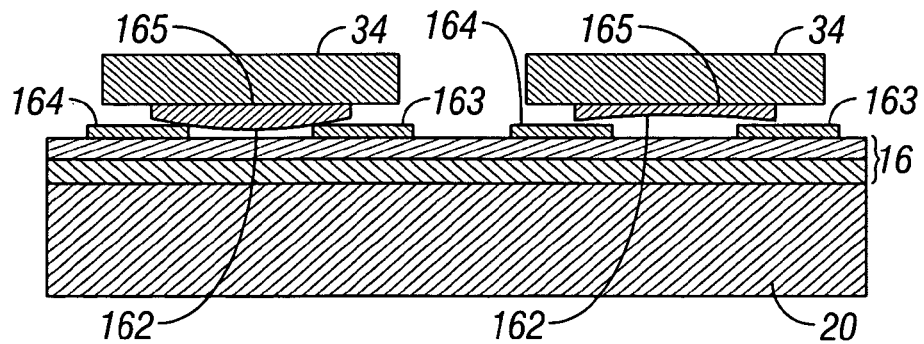

FIGS. 16A through 16D depict an example switch, which may also be called an "ohmic switch," a "series switch," a "MEMS relay," or other suitable names, with different materials for a contact layer 162 and a deformable layer 34 to which the contact layer 162 is connected and/or different materials for an actuation electrode 168 and the deformable layer 34 to which the actuation electrode 168 is connected. FIGS. 16A and 16C illustrate cross-sectional side views of a switch in a relaxed position and an actuated position, respectively, in which the contact layer 162 and the actuation electrode 168 comprise a first material and the deformable layer 34 comprises a second material. FIGS. 16B and 16D illustrate cross-sectional front views of the switches of FIGS. 16A and 16C, respectively.

Benefits may derive from using different materials for the contact layer 162 and/or the actuation electrode 168 and for the deformable layer 34, for example to decouple the electrical properties of the contact layer 162 and/or the actuation electrode 168 from the mechanical properties of the deformable layer 34. For example, the structural design and materials used for the contact layer 162 and/or the actuation electrode 168 can be optimized with respect to the electrical properties, and the structural design and materials used for the deformable layer 34 can be optimized with respect to desired mechanical properties. In certain embodiments, the contact layer 162 and/or the actuation electrode 168 comprises a conductive material (e.g., aluminum, copper, gold) and the deformable layer 34 comprises an insulating material (e.g., $SiO_2$, $SiN_x$).

However, curvature and/or tilt of the contact layer 162 and/or the actuation electrode 168 (as depicted in FIGS. 16A through 16D) resulting from stress gradients may affect the electromechanical response of the switch. For example, different distances between the actuation electrode 168 and the electrode 166 can affect the response time and actuation voltage of the switch. The actuation voltage of the switch may be set according to the distance between the actuation electrode 168 and the electrode 166, so a change in the distance between the actuation electrode 168 and the electrode 166 may cause the device to function improperly or to fail. Moreover, the surface of the contact layer 162 facing the substrate 20 is preferably substantially parallel to the substrate 20. However, curvature and/or tilt of the contact layer 162 may cause the surface of the contact layer 162 facing the substrate 20 to become non-parallel to the substrate 20. The contacting portions of the contact layer 162 may not make full contact with the leads 163, 164 (as depicted in FIGS. 16C and 16D), thereby impeding the conductance of an electrical signal.

Figure 17A:
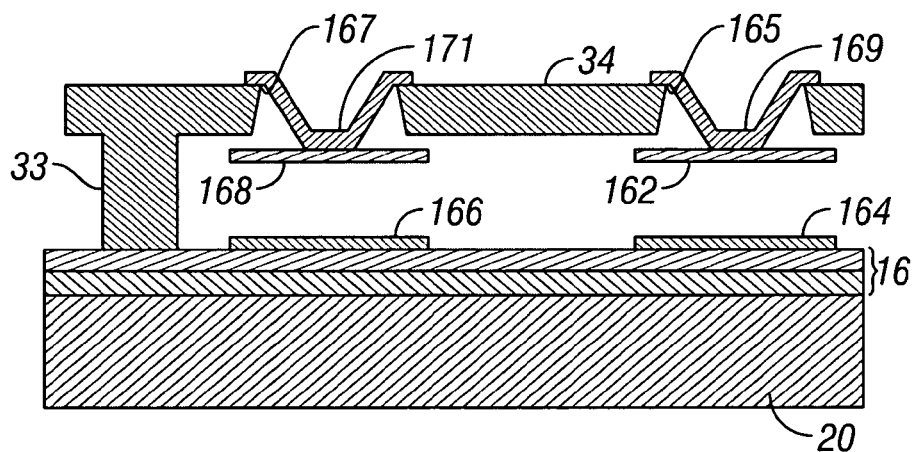
FIGS. 17A-17D depict cross-sectional views of an embodiment of a switch with a contact layer that is not curved and/or tilted.
Figure 17B:
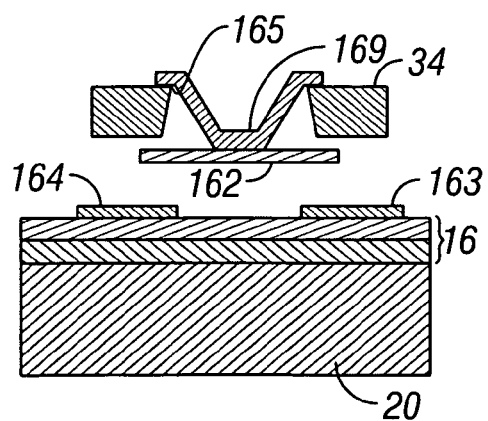
Figure 17C:
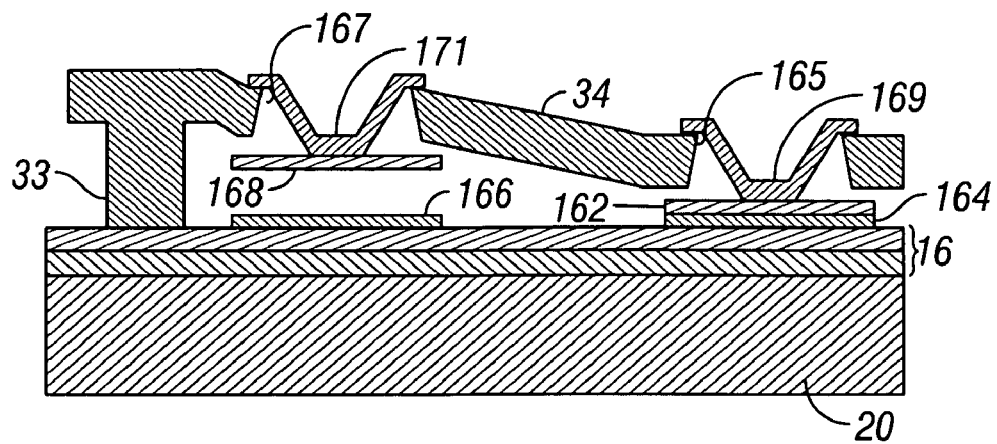
Figure 17D:
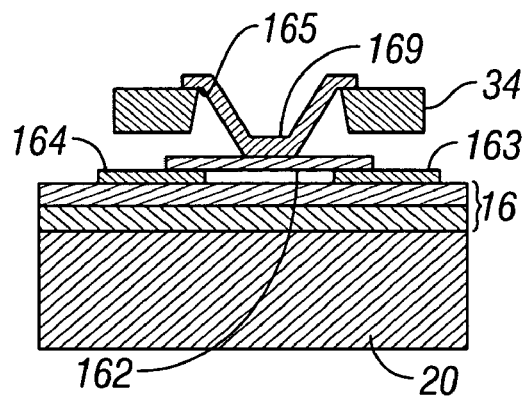

FIGS. 17A and 17C illustrate cross-sectional side views of an embodiment of a switch in a relaxed position and an actuated position, respectively, in which the contact layer 162 and the actuation electrode 168 comprise a first material and the deformable material 34 comprises a second material different from the first material. FIGS. 17B and 17D illustrate cross-sectional front views of the switches of FIGS. 17A and 17C, respectively. In accordance with an embodiment described above with respect to FIG. 9F, a connecting elements 169 is mechanically coupled (e.g., fused) to the deformable layer 34 and the contact layer 162 and the deformable layer 34 and a connecting element 171 is mechanically coupled (e.g., fused) to the actuation electrode 168 and the deformable layer 34. The connecting elements 169, 171 form interfaces 165, 167 between the first material and the second material. The connecting elements 169, 171 may be the same or the connecting element 169 may be different from the connecting element 171. The interfaces 165, 167 between the first material and the second material are spaced from the contact layer 162 and the actuation electrode 168, respectively, thereby causing the distances between the contact layer 162 and the leads 163, 164 to be substantially the same and the surface of the contact layer 162 facing the substrate 20 to be substantially parallel to the substrate 20 and causing the distance between the actuation electrode 168 and the electrode 166 to be substantially the same and the surface of the actuation electrode facing the substrate 20 to be substantially parallel to the substrate 20. It will be understood that the switch may also be in accordance with the embodiments depicted in FIGS. 10 through 12, combinations thereof, and the like. For example, the connecting element 171 may be fused to the actuation electrode 168 while the connecting element 169 is adhered to the contact layer 162.

Figure 18A:
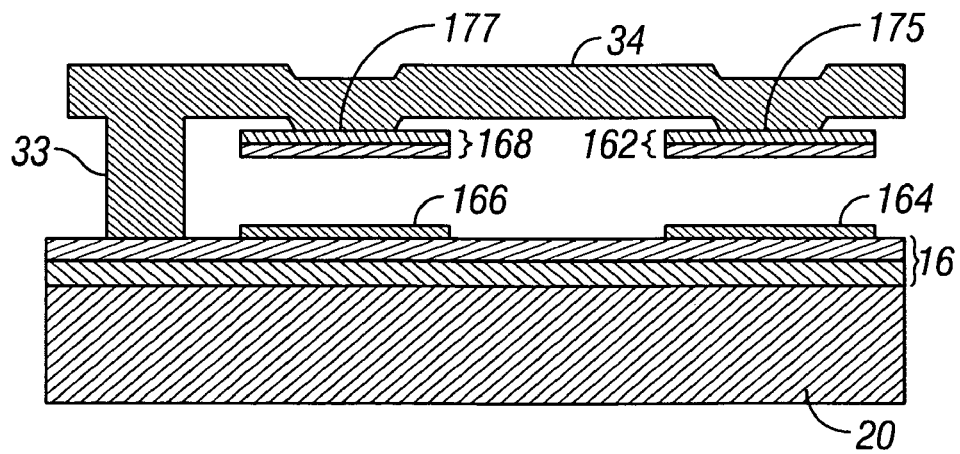
FIGS. 18A-18D depict cross-sectional views of another embodiment of a switch with a contact layer that is not curved and/or tilted.
Figure 18B:
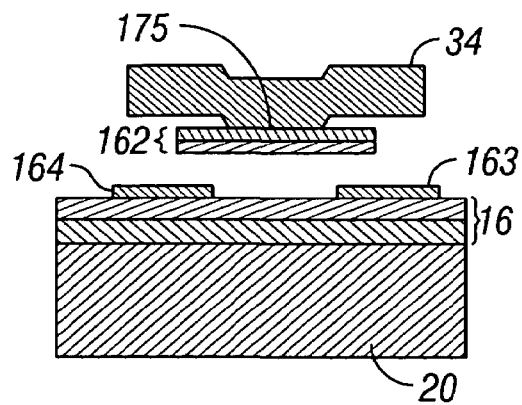
Figure 18C:
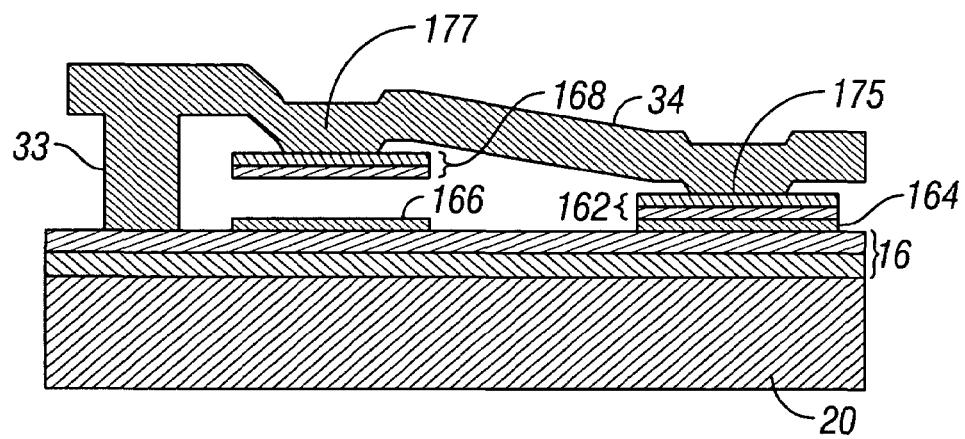
Figure 18D:
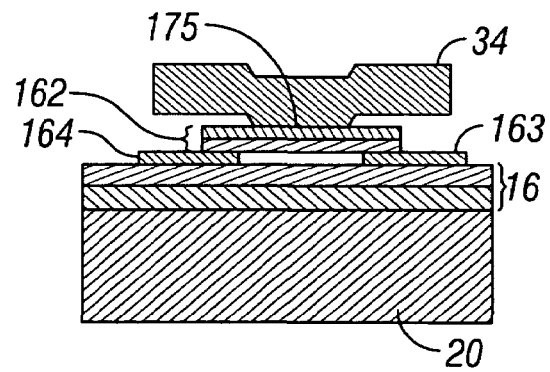

FIGS. 18A and 18C illustrate cross-sectional side views of another embodiment of a switch in a relaxed position and an actuated position, respectively, in which the contact layer 162 and the actuation electrode 168 comprise a first material and the deformable material 34 comprises a second material different from the first material. FIGS. 18B and 18D illustrate cross-sectional front views of the switches of FIGS. 18A and 18C, respectively. In accordance with an embodiment described above with respect to FIG. 13, the deformable layer 34 is mechanically coupled to the contact layer 162 and the actuation electrode 168 at junctions 175, 177, respectively. The contact layer 162 and the actuation electrode 168 have substantially equal internal stresses with the deformable layer 34 at the junctions 175, 177, thereby causing the distances between the contact layer 162 and the leads 163, 164 to be substantially the same and the surface of the contact layer 162 facing the substrate 20 to be substantially parallel to the substrate 20 and causing the distance between the actuation electrode 168 and the electrode 166 to be substantially the same and the surface of the actuation electrode facing the substrate 20 to be substantially parallel to the substrate 20. It will be understood that the switch may also be in accordance with the embodiments depicted in FIGS. 14 and 15, combinations thereof, and the like. For example, the actuation electrode 168 may comprise a bilayer while the contact layer 162 has a graded composition that varies from a first side of the contact layer 162 proximate to the deformable layer 34 to a second side of the contact layer 162 distal from the deformable layer 34.

Various specific embodiments have been described above. Although the invention has been described with reference to these specific embodiments, the descriptions are intended to be illustrative of the invention and are not intended to be limiting. Various modifications and applications may occur to those skilled in the art without departing from the true scope of the invention as defined in the appended claims.

What is claimed is:

1. A microelectromechanical (MEMS) device comprising:
a functional layer comprising a first material; and
a deformable layer comprising a second material different from the first material, the deformable layer mechanically coupled to the functional layer at a junction, wherein the functional layer and the deformable layer have substantially equal internal stresses at the junction.

2. The MEMS device of claim 1, wherein an internal stress of the functional layer at the junction differs from an internal stress of the deformable layer at the junction by less than about 150 MPa.

3. The MEMS device of claim 1, wherein an internal stress of the functional layer at the junction differs from an internal stress of the deformable layer at the junction by less than about 60 MPa.

4. The MEMS device of claim 1, wherein an internal stress of the functional layer at the junction differs from an internal stress of the deformable layer at the junction by less than about 10 MPa.

5. The MEMS device of claim 1, wherein the functional layer has a thickness greater than about 1 micron.

6. The MEMS device of claim 1, wherein the functional layer and the deformable layer have substantially equal coefficients of thermal expansion at the junction.

7. The MEMS device of claim 1, wherein the first material comprises a conductive material.

8. The MEMS device of claim 1, wherein the first material comprises aluminum.

9. The MEMS device of claim 1, wherein the second material comprises nickel.

10. The MEMS device of claim 1, wherein the functional layer comprises a contact layer comprising the first material on a side of the functional layer facing away from the deformable layer.

11. The MEMS device of claim 1, wherein the functional layer comprises a reflective layer comprising the first material on a side of the functional layer facing away from the deformable layer.

12. The MEMS device of claim 11, wherein the functional layer comprises a bilayer comprising the reflective layer and a layer comprising the second material.

13. The MEMS device of claim 12, wherein the reflective layer is less than about 20% as thick as the layer comprising the second material.

14. The MEMS device of claim 12, wherein the reflective layer is less than about 10% as thick as the layer comprising the second material.

15. The MEMS device of claim 12, wherein the reflective layer is less than about 3% as thick as the layer comprising the second material.

16. The MEMS device of claim 12, wherein the first material comprises aluminum and wherein the second material comprises nickel.

17. The MEMS device of claim 1, wherein the functional layer has a graded composition that varies from a first side of the functional layer proximate to the deformable layer to a second side of the functional layer distal from the deformable layer.

18. The MEMS device of claim 17, wherein the functional layer is reflective at the second side of the functional layer.

19. The MEMS device of claim 17, wherein the functional layer comprises an alloy.

20. The MEMS device of claim 19, wherein the alloy comprises at least one element of the second material.

21. The MEMS device of claim 19, wherein the alloy comprises nickel and aluminum.

22. The MEMS device of claim 1, further comprising:
a display;
a processor configured to communicate with the display, the processor configured to process image data; and
a memory device configured to communicate with the processor.

23. The MEMS device of claim 22, further comprising a driver circuit configured to send at least one signal to the display.

24. The MEMS device of claim 23, further comprising a controller configured to send at least a portion of the image data to the driver circuit.

25. The MEMS device of claim 22, further comprising an image source module configured to send the image data to the processor.

26. The MEMS device of claim 25, wherein the image source module comprises at least one of a receiver, transceiver, and transmitter.

27. The MEMS device of claim 22, further comprising an input device configured to receive input data and to communicate the input data to the processor.

28. A microelectromechanical (MEMS) device comprising:
means for controlling a signal, the controlling means comprising a first material; and
means for supporting the controlling means, the supporting means comprising a second material different from the first material, the supporting means mechanically coupled to the controlling means at a junction, wherein the controlling means and the supporting means have substantially equal internal stresses at the junction.

29. The MEMS device of claim 28, wherein the supporting means comprises a mechanical layer.

30. The MEMS device of claim 28, wherein the controlling means comprises a reflective layer that controllably reflects an electromagnetic signal.

31. The MEMS device of claim 28, wherein the controlling means comprises a conductive layer that controllably conducts an electrical signal.

32. A method of manufacturing a microelectromechanical (MEMS) device on a substrate, the method comprising:
forming a functional layer comprising a first material;
forming a sacrificial layer comprising sacrificial material over the functional layer;
forming a hole in the sacrificial layer to expose a portion of the functional layer; and
forming a deformable layer comprising a second material over the sacrificial layer, the second material different from the first material, the deformable layer fusing to the functional layer at a junction in the exposed portion of the functional layer, wherein the functional layer and the deformable layer have substantially equal internal stresses at the junction.

33. The method of claim 32, further comprising removing the sacrificial layer.

34. The method of claim 32, wherein forming the functional layer comprises:
depositing a reflective material comprising the first material; and depositing the second material over the reflective material.

35. The method of claim 32, wherein forming the functional layer comprises:
   depositing a conductive material comprising the first material; and
   depositing the second material over the reflective material.

36. The method of claim 32, wherein forming the functional layer comprises depositing the first material while modifying a deposition parameter, the functional layer having a graded composition that varies from a first side of the functional layer proximate to the deformable layer to a second side of the functional layer distal from the deformable layer.

37. The method of claim 36, wherein modifying includes varying at least one of temperature, pressure, and power.

38. The method of claim 32, wherein the functional layer comprises an alloy.

39. The method of claim 38, wherein the alloy comprises at least one element of the second material.

40. The method of claim 38, wherein the alloy comprises nickel and aluminum.

41. The method of claim 38, wherein modifying includes varying a ratio of a flowrate of a first material precursor to a flowrate of a second material precursor.

42. The method of claim 32, wherein forming the hole in the sacrificial layer comprises:
   forming a patterned layer over the sacrificial layer;
   etching the sacrificial material uncovered by the patterned layer; and
   removing the patterned layer.

43. The method of claim 42, wherein etching the sacrificial material comprises selectively etching the sacrificial material and negligibly etching the functional layer.

44. A microelectromechanical (MEMS) device fabricated by the method of claim 32.

* * * * *

UNITED STATES PATENT AND TRADEMARK OFFICE
CERTIFICATE OF CORRECTION

PATENT NO. : 7,385,744 B2 Page 1 of 2
APPLICATION NO. : 11/476998
DATED : June 10, 2008
INVENTOR(S) : Lior Kogut, Ming-Hau Tung and Brian Arbuckle It is certified that error appears in the above-identified patent and that said Letters Patent is hereby corrected as shown below:

Column 1 (Other Publications), line 19, delete "curcuit" and insert -- circuit --, therefor.

Column 1 (Other Publications), line 20, delete "Swithches" and insert -- Switches --, therefor.

Column 1 (Other Publications), line 21, delete "Uing" and insert -- Using --, therefor.

Column 1 (Other Publications), line 29, delete "Quanum" and insert -- Quantum --, therefor.

Column 1 (Other Publications), line 33, delete "Mechnically" and insert -- Mechanically --, therefor.

Column 2 (Other Publications), line 7, delete "Mictrostructure" and insert -- Microstructure --, therefor.

Column 2 (Other Publications), line 9, delete "IBBoston" and insert -- Ibbotson --, therefor.

Column 2 (Other Publications), line 29, delete "Michromachined" and insert -- Micromachined --, therefor.

Column 2 (Other Publications), line 37, delete "Relective" and insert -- Reflective --, therefor.

Column 2 (Other Publications), line 49, after "Piscatawny" delete "NY," and insert -- NJ, --, therefor.

Column 2 (Other Publications), line 58, delete "Patterened" and insert -- Patterned --, therefor.

Column 2 (Other Publications), line 66, delete "Micromaching" and insert -- Micromachining --, therefor.

UNITED STATES PATENT AND TRADEMARK OFFICE
CERTIFICATE OF CORRECTION

PATENT NO. : 7,385,744 B2
APPLICATION NO. : 11/476998
DATED : June 10, 2008
INVENTOR(S) : Lior Kogut, Ming-Hau Tung and Brian Arbuckle It is certified that error appears in the above-identified patent and that said Letters Patent is hereby corrected as shown below:

Column 1 (Other Publications), line 1, delete "Relective" and insert -- Reflective --, therefor.

Column 2 (Other Publications), line 1, delete "Reprot" and insert -- Report --, therefor.

Column 2 (Other Publications), line 13, delete "66/2205," and insert -- 66/2005, --, therefor.

At column 6, line 29, after "respectively" insert -- . --.

Signed and Sealed this

Eleventh Day of August, 2009

David J. Kappos
*Director of the United States Patent and Trademark Office*